(12) United States Patent
Long et al.

(10) Patent No.: US 12,302,723 B2
(45) Date of Patent: *May 13, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yue Long, Beijing (CN); Weiyun Huang, Beijing (CN); Chao Zeng, Beijing (CN); Meng Li, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/619,330

(22) Filed: Mar. 28, 2024

(65) Prior Publication Data

US 2024/0251619 A1    Jul. 25, 2024

Related U.S. Application Data

(63) Continuation of application No. 17/255,888, filed as application No. PCT/CN2019/098938 on Aug. 1, 2019, now Pat. No. 11,991,905.

(51) Int. Cl.
*H10K 59/131*    (2023.01)
*H10K 50/844*    (2023.01)
*H10K 59/121*    (2023.01)

(52) U.S. Cl.
CPC ......... *H10K 59/131* (2023.02); *H10K 50/844* (2023.02); *H10K 59/121* (2023.02)

(58) Field of Classification Search
CPC .. H10K 59/131; H10K 59/121; H10K 50/844; H01L 23/522
See application file for complete search history.

(56) References Cited

U.S. PATENT DOCUMENTS 7,928,656 B2   4/2011   Imamura
9,406,898 B2   8/2016   Yamazaki et al.
(Continued)

FOREIGN PATENT DOCUMENTS

CN   105977273 A   9/2016
CN   106711171 A   5/2017
(Continued)

OTHER PUBLICATIONS

International search report of PCT application No. PCT/CN2019/098938 issued on Apr. 22, 2020.
(Continued)

*Primary Examiner* — Bac H Au
(74) *Attorney, Agent, or Firm* — Lippes Mathias LLP

(57) ABSTRACT

Provided is a display substrate including a base substrate, a plurality of pixel units, at least one first power line, a blocking structure, an auxiliary connection structure, a cathode layer, and a first organic pattern. A distance between a first connection position closer to a first portion of the at least one first power line and the blocking structure is arranged to be larger.

18 Claims, 16 Drawing Sheets

(56) References Cited

U.S. PATENT DOCUMENTS

| | | | |
|---|---|---|---|
| 9,947,898 B2 | 4/2018 | Kim | |
| 11,991,905 B2* | 5/2024 | Long | H01L 23/522 |
| 12,010,885 B2* | 6/2024 | Long | H10K 59/121 |
| 2003/0168966 A1 | 9/2003 | Kobayashi et al. | |
| 2011/0199564 A1 | 8/2011 | Moriwaki | |
| 2011/0272714 A1 | 11/2011 | Lhee | |
| 2012/0043565 A1 | 2/2012 | Sagawa | |
| 2014/0367661 A1 | 12/2014 | Akagawa et al. | |
| 2016/0013441 A1 | 1/2016 | Hong | |
| 2016/0079324 A1 | 3/2016 | Go et al. | |
| 2016/0148562 A1 | 5/2016 | Jung | |
| 2016/0268356 A1 | 9/2016 | Go et al. | |
| 2016/0351635 A1 | 12/2016 | Li | |
| 2017/0141352 A1 | 5/2017 | Shin | |
| 2017/0237038 A1 | 8/2017 | Kim et al. | |
| 2017/0323936 A1 | 11/2017 | Lee et al. | |
| 2017/0331058 A1 | 11/2017 | Seo et al. | |
| 2017/0345881 A1 | 11/2017 | Kim et al. | |
| 2017/0365814 A1 | 12/2017 | Kim et al. | |
| 2018/0033998 A1 | 2/2018 | Kim et al. | |
| 2018/0151838 A1 | 5/2018 | Park et al. | |
| 2018/0158741 A1 | 6/2018 | Kim et al. | |
| 2019/0006442 A1 | 1/2019 | Byun et al. | |
| 2019/0058156 A1 | 2/2019 | Sun et al. | |
| 2019/0221625 A1 | 7/2019 | Go et al. | |
| 2021/0134910 A1 | 5/2021 | Yang et al. | |
| 2021/0225994 A1 | 7/2021 | Long et al. | |
| 2021/0335950 A1 | 10/2021 | Wang et al. | |
| 2021/0351263 A1 | 11/2021 | Okabe et al. | |
| 2023/0011418 A1 | 1/2023 | Long et al. | |

FOREIGN PATENT DOCUMENTS

| | | | |
|---|---|---|---|
| CN | 107482042 A | 12/2017 | |
| CN | 107527551 A | 12/2017 | |
| CN | 108320705 A | 7/2018 | |
| CN | 109935601 A | 6/2019 | |
| EP | 3067953 A1 | 9/2016 | |
| JP | WO2003060858 A1 | 5/2005 | |
| JP | 2012043583 A | 3/2012 | |
| JP | 2014241241 A | 12/2014 | |
| JP | 2018092158 A | 6/2018 | |
| KR | 20120072173 A | 7/2012 | |
| KR | 20140087499 A | 7/2014 | |
| KR | 20170142232 A | 12/2017 | |
| KR | 20180068011 A | 6/2018 | |
| KR | 20190057829 A | 5/2019 | |
| KR | 20190079998 A | 7/2019 | |
| WO | 2016086728 A1 | 6/2016 | |

OTHER PUBLICATIONS

China National Intellectual Property Administration, First office action of Chinese application No. 201980001239.1 issued on Sep. 29, 2021, which is foreign counterpart application of this US application.

China National Intellectual Property Administration, Second office action of Chinese application No. 201980001239.1 issued on May 9, 2022, which is foreign counterpart application of this US application.

China National Intellectual Property Administration, Third office action of Chinese application No. 201980001239.1 issued on Aug. 29, 2022, which is foreign counterpart application of this US application.

Extended European search report of counterpart European application No. 19933245.3 issued on Jul. 14, 2022.

First office action of Taiwanese application No. 109126171 issued on Apr. 6, 2021.

First office action of Mexico application No. MX/a/2020/000612 issued on Apr. 13, 2023.

Decision on Grant of Russian application No. 2020101480/28 issued on Jun. 2, 2020.

Search Report of Russian application No. 2020101480/28 issued on May 29, 2020.

First office action of Brazilian application No. BR112020000834-6 issued on Jan. 4, 2024.

Examination report of counterpart Indian application No. 201947051746 issued on Mar. 3, 2022.

Notice of Reasons for Refusal of Japanese application No. 2019-569392 issued on Mar. 20, 2023.

Notice of Reasons for Refusal of Japanese application No. 2019-569392 issued on Sep. 19, 2023.

Decision to Grant a Patent of Japanese application No. 2019-569392 issued on Oct. 30, 2023.

Examination report of Australian application No. 2019279976 issued on Jun. 30, 2020.

Non-final office Action of U.S. Appl. No. 17/255,888 issued on Oct. 5, 2023.

Notice of allowance of U.S. Appl. No. 17/255,888 issued on Jan. 23, 2024.

Notice of Reasons for Refusal of Japanese application No. 2023-200957 issued on Sep. 30, 2024.

* cited by examiner

DISPLAY SUBSTRATE AND DISPLAY DEVICE

CROSS-REFERENCE TO RELATED APPLICATION

The present application is a continuation of U.S. patent application Ser. No. 17/255,888, filed on Aug. 1, 2019, which is a national phase application based on PCT/CN2019/098938, filed on Aug. 1, 2019 and entitled "DISPLAY SUBSTRATE AND DISPLAY APPARATUS", which is incorporated herein by reference in its entirety.

TECHNICAL FIELD

The present disclosure relates to a field of display technology, in particular to a display substrate and a display device.

BACKGROUND

A display substrate generally comprises a plurality of pixel units arranged in an array in a display region of a base substrate, a power line (generally referred to as a VDD line) for providing a positive power signal to each of the pixel units, and a power line (generally referred to as a VSS line) for providing a negative power signal to a cathode layer in the display substrate. In a case that the power line enters an encapsulation region from a side of a driver chip, for example, in a case that the power line enters a region provided on a side, close to the pixel units, of a dam structure from a bonding region, that is, at a place close to a portion (line inlet port), where the power line passes through, of the dam structure, there is a risk of introducing water and oxygen, and the encapsulation performance needs to be improved.

SUMMARY

The present disclosure provides a display substrate and a display device. The technical solutions are as follows:

On one hand, a display substrate is provided, and the display substrate comprises:
a base substrate:
a plurality of pixel units, in which the plurality of pixel units are located on the base substrate:
a blocking structure, in which the blocking structure surrounds the plurality of pixel units:
an auxiliary connection structure, comprising a first side surface and a second side surface which are opposite to each other, in which the first side surface is closer to the plurality of pixel units than the second side surface is:
a cathode layer, located on a side of the auxiliary connection structure away from the base substrate:
a first organic pattern, located on the side of the auxiliary connection structure away from the base substrate:
at least one first power line, located on the base substrate, wherein the at least one first power line comprises a first portion, a second portion and a first metal layer, wherein the first portion is located on a side of the blocking structure away from the plurality of pixel units and is configured to receive a power signal, the second portion is connected with the cathode layer by the auxiliary connection structure, and the second portion has a first connection position and a second connection position, the second portion is connected with the auxiliary connection structure at both the first connection position and the second connection position, and a distance between the first connection position and the blocking structure is greater than a distance between the second connection position and the blocking structure:
wherein the at least one first power line further comprises a second metal layer located on a side of the first metal layer away from the base substrate, and a side of the second metal layer away from the first metal layer is in contact with the auxiliary connection structure: or
wherein the display substrate further comprises an auxiliary metal layer located on a side of the first metal layer away from the base substrate, and a side of the auxiliary metal layer away from the first metal layer is in contact with the auxiliary connection structure.

Optionally, the display substrate comprises a bonding region, the bonding region is located on the side of the blocking structure away from the plurality of pixel units, and the first connection position is closer to the bonding region than the second connection position is.

Optionally, an orthographic projection of the auxiliary connection structure on the base substrate comprises a first projection region and a second projection region, the first projection region does not overlap with the orthographic projection of the blocking structure on the base substrate, and the second projection region overlaps with the orthographic projection of the blocking structure on the base substrate to form a first overlapping region:
and the first projection region is closer to the first portion than the second projection region is.

Optionally, the first organic pattern covers at least a portion of the second side surface.

Optionally, the second side surface comprises a portion covered by the first organic pattern and the blocking structure.

Optionally, the auxiliary connection structure has a ring structure surrounding the plurality of pixel units.

Optionally, the display substrate further comprises: at least one second power line:
one end of the at least one second power line is located on the side of the blocking structure away from the plurality of pixel units to receive the power signal, and the other end of the at least one second power line is located between the blocking structure and the plurality of pixel units, and is connected with the cathode layer by the auxiliary connection structure:
an orthographic projection of the first organic pattern on the base substrate overlaps with an orthographic projection of the at least one second power line on the base substrate to obtain a second overlapping region, and the second overlapping region does not overlap with the orthographic projection of the blocking structure on the base substrate.

Optionally, the one end of the at least one second power line is located in the middle of the side of the blocking structure away from the plurality of pixel units.

Optionally, a distance between the second overlapping region and the orthographic projection of the blocking structure on the base substrate is greater than a threshold distance.

Optionally, the threshold distance ranges from 80 microns to 150 microns.

Optionally, the display substrate further comprises: a row driving region between the blocking structure and the plurality of pixel units:
and a distance between the row driving region and the orthographic projection of the at least one second power line on the base substrate is larger than a distance between the row driving region and an orthographic projection of the at least one first power line on the base substrate.

Optionally, the display substrate further comprises:
a passivation layer, covering the at least one first power line:
and the passivation layer is further provided with an opening, a side of the auxiliary connection structure close to the base substrate is connected with the at least one first power line by the opening, and the other side of the auxiliary connection structure away from the base substrate is connected with the cathode layer.

Optionally, the blocking structure comprises: a first blocking dam and a second blocking dam:
the first blocking dam is farther away from the plurality of pixel units than the second blocking dam is, and a thickness of the first blocking dam is greater than a thickness of the second blocking dam:
the first blocking dam comprises: a first planarization layer pattern, a second planarization layer pattern and a second organic pattern arranged in a direction away from the base substrate:
the second blocking dam comprises: a third planarization layer pattern and a third organic pattern arranged in the direction away from the base substrate:
and the second planarization layer pattern and the third planarization layer pattern comprise a same material, and the first organic pattern, the second organic pattern and the third organic pattern comprise a same material.

Optionally, the blocking structure comprises: a first blocking dam and a second blocking dam;
the first blocking dam is farther away from the plurality of pixel units than the second blocking dam is, and a thickness of the first blocking dam is greater than a thickness of the second blocking dam:
the first blocking dam comprises: a planarization layer pattern and a second organic pattern sequentially stacked in a direction away from the base substrate;
the second blocking dam comprises: a third organic pattern arranged on the base substrate:
and the first organic pattern, the second organic pattern and the third organic pattern comprise a same material.

Optionally, the first blocking dam further comprises: a fourth organic pattern arranged on a side of the second organic pattern away from the base substrate:
the second blocking dam further comprises: a fifth organic pattern arranged on a side of the third organic pattern away from the base substrate;
and the fourth organic pattern and the fifth organic pattern comprise a same material.

Optionally, the blocking structure comprises: a first blocking dam and a second blocking dam:
the first blocking dam is farther away from the plurality of pixel units than the second blocking dam is, and a thickness of the first blocking dam is greater than a thickness of the second blocking dam;
and the first organic pattern comprises a portion in direct contact with the second blocking dam.

Optionally, the at least one first power line comprises: a straight portion and an arc-shaped portion which together surround a region where the plurality of pixel units are located:
and an orthographic projection of the portion of the first organic pattern in direct contact with the second blocking dam is in an orthographic projection of the arc-shaped portion on the base substrate.

Optionally, the second portion of the at least one first power line comprises: the straight portion and the arc-shaped portion which together surround the region where the plurality of pixel units are located.

The first blocking dam is a first ring, and the second blocking dam is a second ring:
the first organic pattern and a portion of the third organic pattern form a third ring, an orthographic projection of the third ring on the base substrate is located inside an orthographic projection of the second ring on the base substrate, and the orthographic projection of the second ring on the base substrate is located inside an orthographic projection of the first ring on the base substrate:
and the third ring surrounds the plurality of pixel units.

Optionally, the at least one first power line comprises: a first metal layer; the display substrate further comprises: an auxiliary metal layer on a side of the first metal layer away from the base substrate;
and a side of the auxiliary metal layer away from the first metal layer is in contact with the auxiliary connection structure.

Optionally, the first metal layer, the passivation layer, the first planarization layer pattern, the auxiliary metal layer, the second planarization layer pattern and the first organic pattern of the display substrate are stacked in the direction away from the base substrate.

Optionally, the at least one first power line comprises: a first metal layer and a second metal layer arranged in the direction away from the base substrate:
and a side of the second metal layer away from the first metal layer is in contact with the auxiliary connection structure.

Optionally, the first metal layer, the first planarization layer pattern, the second metal layer, the passivation layer, the second planarization layer pattern and the first organic pattern of the display substrate are stacked in the direction away from the base substrate.

Optionally, a side surface of the first portion of the at least one first power line located on the side of the blocking structure away from the plurality of pixel units has a plurality of tooth-shaped convex structures.

Optionally, orthographic projections of the convex structures on the base substrate do not overlap with the orthographic projection of the blocking structure on the base substrate.

Optionally, the display substrate further comprises: an encapsulation layer:
and the encapsulation layer is located on a side of the at least one first power line away from the base substrate, and the encapsulation layer covers a region enclosed by the blocking structure.

Optionally, the display substrate further comprises: a plurality of third power lines on the base substrate:
and the plurality of third power lines are electrically connected with transistors in the plurality of pixel units.

Optionally, an orthographic projection of at least one of the plurality of third power lines on the base substrate is adjacent to the orthographic projection of the first power line on the base substrate:
and orthographic projections of the plurality of third power lines on the base substrate have an overlapping region with the orthographic projection of the auxiliary connection structure on the base substrate, and in the overlapping region, a passivation layer is arranged between the plurality of third power lines and the auxiliary connection structure.

Optionally, a width of an overlapped portion, which is connected with the first power line and overlaps with the first power line, of the auxiliary connection structure is arranged to be relatively wider, and a width of a portion of the auxiliary connection structure away from the overlapped portion is arranged to be relatively narrow.

On the other hand, a display device is provided, and the display device comprises: any one of the display substrates mentioned above.

The beneficial effects of the technical solutions provided by the present disclosure at least are as follows.

The display substrate and the display device are provided in at least one embodiment of the present disclosure, and the display substrate comprises the base substrate, the plurality of pixel units, the at least one first power line, the blocking structure, the auxiliary connection structure, the cathode layer, and the first organic pattern. By arranging the distance between the first connection position closer to the first portion of the at least one first power line and the blocking structure to be larger, the water vapor introduced from the first portion of the first power line into the plurality of pixel units through the hydrophilic material in the blocking structure is reduced, which ensures the yield of the display substrate, and thus the display effect of the display substrate is guaranteed.

BRIEF DESCRIPTION OF THE DRAWINGS

In order to clearly illustrate the technical solutions of the embodiments of the present disclosure, the drawings of the embodiments will be briefly described. It is apparent that the described drawings are only related to some embodiments of the present disclosure. For those ordinary skilled in the art, other drawings can be obtained based on these drawings without any creative work.

DETAILED DESCRIPTION

In order to make objects, technical solutions and advantages of the present disclosure more clear, embodiments of the present disclosure will be described in a clearly and fully understandable way in connection with the related drawings.

In related technologies, in order to reduce the risk of water and oxygen erosion brought by power lines entering an encapsulation region from an outside of the encapsulation region, the total number of the power lines entering the encapsulation region is usually reduced: in this way, in order to further ensure the electrical signal transmission of the power lines, for example, to ensure the electrical connection between a cathode VSS line and a cathode, one end of the VSS line needs to be connected with the cathode layer by an auxiliary connection structure located in the encapsulation region of the base substrate after the one end of the VSS line enters the encapsulation region, for example, enters a dam structure (a blocking structure). However, the inventors found that if the auxiliary connection structure such as a conductive metal structure is directly added, although a connection effect between the cathode and the cathode power line is improved, a side surface of the auxiliary connection structure easily has etching defects, which also increases the risk of water and oxygen erosion near the line inlet port.

Figure 1:
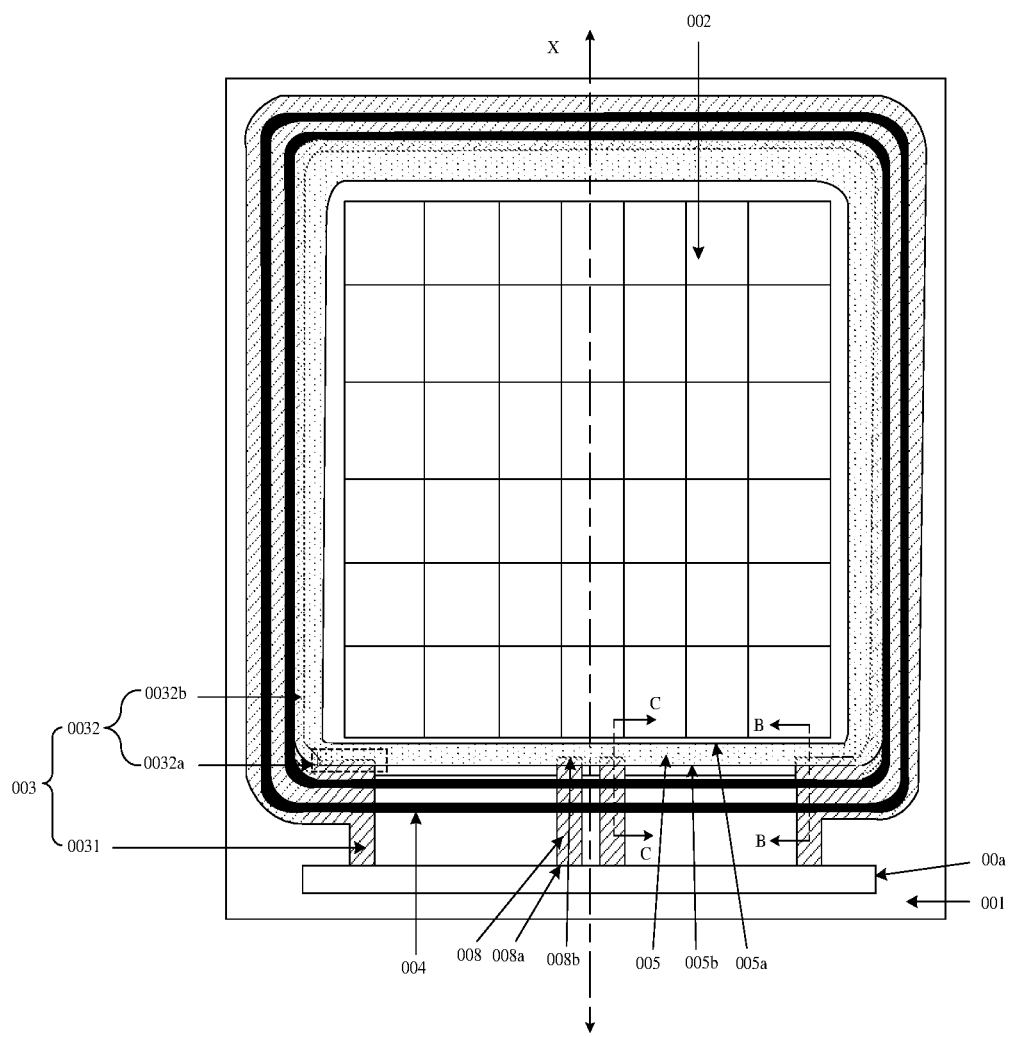
FIG. 1 is a structural schematic diagram of a display substrate provided by the embodiments of the present disclosure.
Figure 2:
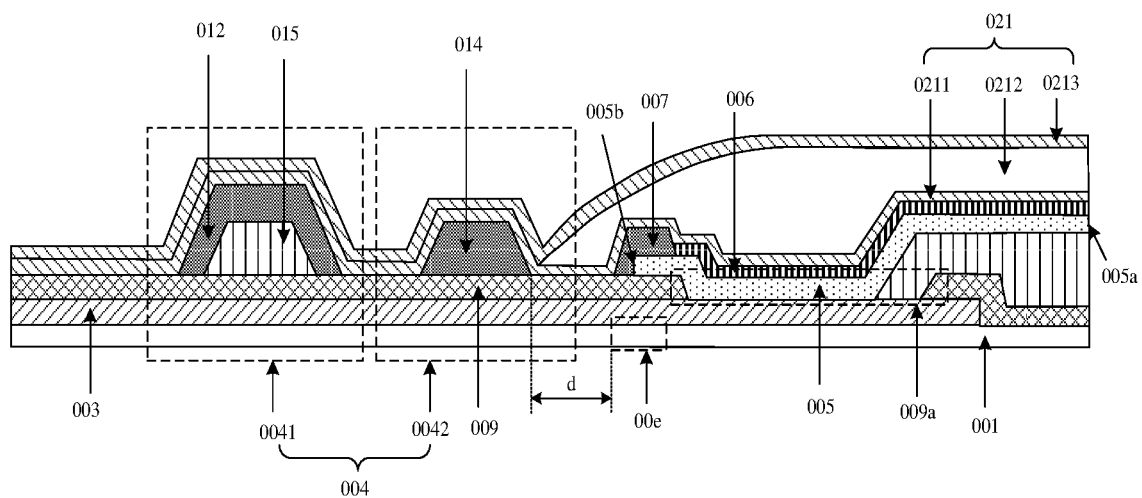
FIG. 2 is a cross-sectional structural schematic diagram of the display substrate shown in FIG. 1 taken along a BB line.

FIG. 1 is a structural schematic diagram of a display substrate provided by embodiments of the present disclosure. FIG. 2 is a cross-sectional structural schematic diagram of the display substrate shown in FIG. 1 taken along a BB line. The display substrate is a flexible panel, for example, a foldable panel. Combining FIG. 1 with FIG. 2, the display substrate comprises: a base substrate 001, a plurality of pixel units 002, at least one first power line 003, a blocking structure 004, an auxiliary connection structure 005, a cathode layer 006, and a first organic pattern 007. The plurality of pixel units 002 are located on the base substrate 001. For example, one first power line 003 is shown in FIG. 1.

The at least one first power line 003 is located on the base substrate 001. The blocking structure (i.e. dam structure) 004 for example surrounds the plurality of pixel units 002. The auxiliary connection structure 005 comprises a first side surface 005a and a second side surface 005b which are opposite to each other, the first side surface 005a is closer to the plurality of pixel units 002 than the second side surface 005b is. The cathode layer 006 is located on a side of the auxiliary connection structure 005 away from the base substrate 001. The first organic pattern 007 for example is located on the side of the auxiliary connection structure 005 away from the base substrate 001.

With reference to FIG. 1, the at least one first power line 003 comprises a first portion 0031 and a second portion 0032, the first portion 0031 is located on a side of the blocking structure 004 away from the plurality of pixel units 002, and the first portion 0031 is configured for receiving a power signal. For example, the first portion 0031 is connected with a driver chip to receive the power signal provided by the driver chip. The second portion 0032 is connected with the cathode layer 006 by the auxiliary connection structure 005.

Figure 3:
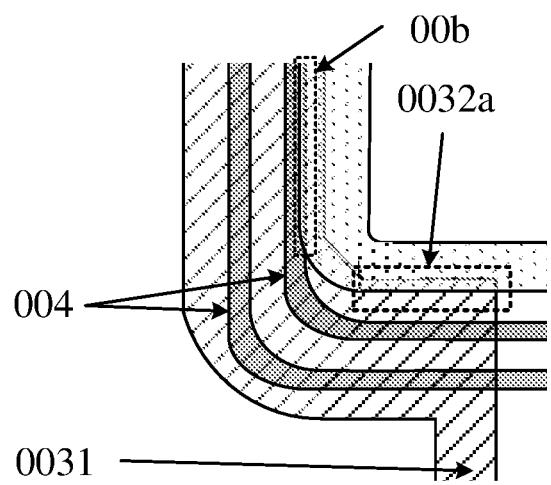
FIG. 3 is a schematic diagram of a local structure of the display substrate shown in FIG. 1.

FIG. 3 is a schematic diagram of a local structure of the display substrate shown in FIG. 1. With reference to FIG. 1 and FIG. 3, the second portion 0032 has a first connection position 0032a and a second connection position 0032b, the second portion 0032 is connected with the auxiliary connection structure 005 at both the first connection position 0032a and the second connection position 0032b, and a distance between the first connection position 0032a and the blocking structure 004 is larger than a distance between the second connection position 0032b and the blocking structure 004. That is to say, the first connection position 0032a of the second portion 0032 of the at least one first power line 003 is not in contact with the blocking structure 004. For example, an orthographic projection of the first connection position 0032a on the base substrate 001 does not overlap with an orthographic projection of the blocking structure 004 on the base substrate 001. The second connection position 0032b is located in a region covered by the blocking structure 004, for example, the second connection position 0032b is in contact with the blocking structure 004. In order to clearly illustrate a position relationship between the first power line 003 and the auxiliary connection structure 005, the cathode layer 006 is not shown in FIG. 1.

In the embodiments of the present disclosure, by arranging the distance between the first connection position 0032a which is closer to the first portion 0031 and the blocking structure 004 to be larger, the water vapor introduced from the first portion 0031 of the first power line 003 into the plurality of pixel units 002 through a hydrophilic material in the blocking structure 004 is reduced, which ensures the yield of the display substrate.

Moreover, the second connection position 0032b is farther away from the first portion 0031 than the first connection position 0032a is and a path of introducing water vapor is long; and thus, even if the distance between the second connection position 0032b and the blocking structure 004 is arranged to be smaller, the water vapor from the first portion 0031 of the first power line 003 is not introduced into the plurality of pixel units 002 at the second connection position 0032b. Moreover, if the distance between the second connection position 0032b and the blocking structure 004 is arranged to be smaller, the region of the base substrate 001 occupied by the auxiliary connection structure 005 and the blocking structure 004 is reduced, so as to facilitate the realization of a narrow frame display substrate.

Each of the first connection position 0032a and the second connection position 0032b refers to: a part, that is in contact with the auxiliary connection structure 005, of the second portion 0032 of the first power line 003: in the embodiments of the present disclosure, each of the first connection position 0032a and the second connection position 0032b for example refers to: a part, that is in direct contact with the auxiliary connection structure 005, of the second portion 0032. The shape of the two connection positions is approximately the same as the shape of an overlapping region of the orthographic projection of the second portion 0032 on the base substrate 001 and the orthographic projection of the auxiliary connection structure 005 on the base substrate 001.

In summary; the embodiments of the present disclosure provide the display substrate, and the display substrate comprises the base substrate, the plurality of pixel units, the at least one first power line, the blocking structure, the auxiliary connection structure, the cathode layer, and the first organic pattern. By arranging the distance between the first connection position closer to the first portion of the at least one first power line and the blocking structure to be larger, the water vapor introduced from the first portion of the first power line into the plurality of pixel units through the hydrophilic material in the blocking structure is reduced, which ensures the yield of the display substrate, and thus the display effect of the display substrate is guaranteed.

Optionally, as illustrated in FIG. 1, the display substrate further comprises a bonding region 00a, the bonding region 00a is located on the side of the blocking structure 004 away from the plurality of pixel units 002, and the first connection position 0032a is closer to the bonding region 00b than the second connection position 0032b is. By the sentence that the first connection position 0032a is closer to the bonding region 00b than the second connection position 0032b is, it refers to that: a minimum value of the distances between respective portions of the first connection position 0032a and the bonding region 00b is greater than a minimum value of the distances between respective portions of the second connection position 0032a and the bonding region 00b.

It should be noted that, in at least one embodiment of the present disclosure, the region of the orthographic projection of the plurality of pixel units 002 on the base substrate 001 is an effective active area (AA) of the display substrate. Therefore, the blocking structure 004 for example surrounds the AA region. The cathode layer 006 for example covers a whole of the AA region.

Optionally, in at least one embodiment of the present disclosure, an orthographic projection of the cathode layer 006 on the base substrate 001 covers the orthographic projection of the plurality of pixel units 002 on the base substrate 001, and the orthographic projection of the cathode layer 006 on the base substrate 001 is located in the orthographic projection of the region enclosed by the blocking structure 004 on the base substrate 001.

Figure 4:
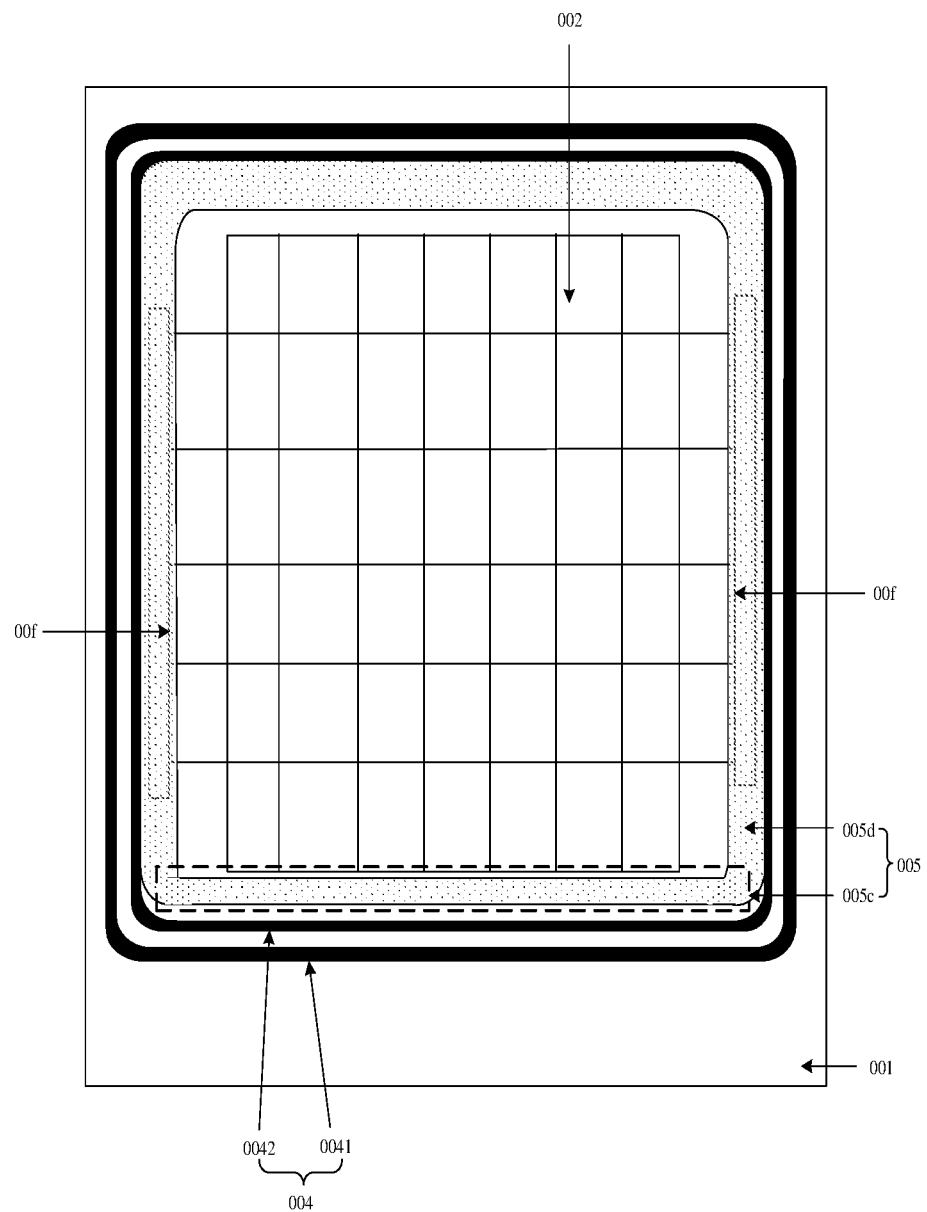
FIG. 4 is another structural schematic diagram of the display substrate provided by the embodiments of the present disclosure.
Figure 5:
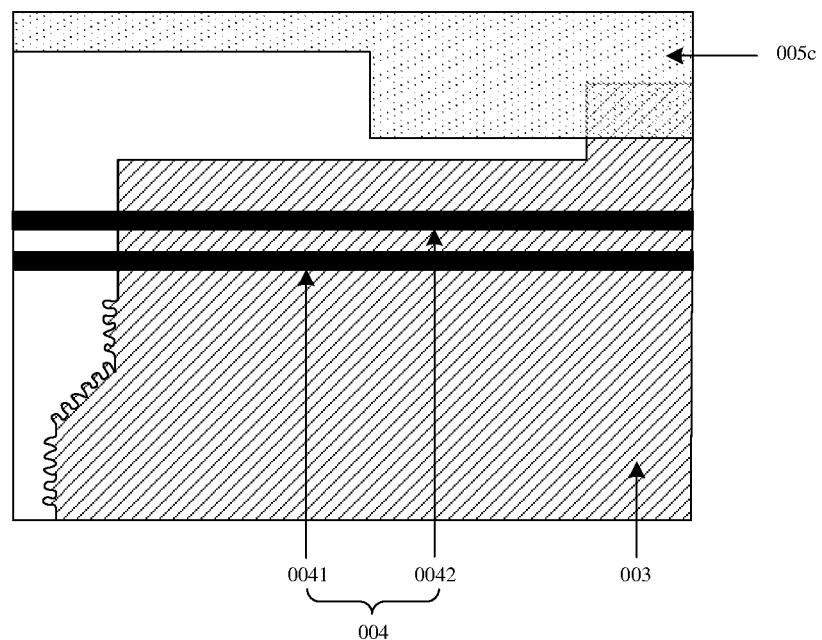
FIG. 5 is another schematic diagram of a local structure of the display substrate provided by the embodiments of the present disclosure.

FIG. 4 is another structural schematic diagram of the display substrate provided by the embodiments of the present disclosure. FIG. 5 is a schematic diagram of a local structure of the display substrate provided by the embodiments of the present disclosure. With reference to FIG. 4 and FIG. 5, an orthographic projection of the auxiliary connection structure 005 on the base substrate 001 comprises a first projection region 005c and a second projection region 005d. Combining with FIG. 1, the first projection region 005c is closer to the first portion 0031 than the second projection region 005d is. The first projection region 005c does not overlap with the orthographic projection of the blocking structure 004 on the base substrate 001, and the second projection region 005d overlaps with the orthographic projection of the blocking structure 004 on the base substrate 001 to form a first overlapping region 00b.

Because the organic material of the blocking structure 004 is the hydrophilic material, the first projection region 005c of the orthographic projection of the auxiliary connection structure 005 on the base substrate 001 does not overlap with the orthographic projection of the blocking structure 004 on the base substrate 001, it is possible to prevent the water vapor from the first portion 0031 from entering into the plurality of pixel units 002 through the hydrophilic material covering the auxiliary connection structure 005, which further ensures the display effect of the display substrate.

Optionally, the width of the overlapped portion, which is connected with the first power line 003 and overlaps with the first power line 003, of the auxiliary connection structure 005 is arranged to be relatively wider, so that a contact resistance between the auxiliary connection structure 005 and the first power line 003 is as small as possible. With reference to FIG. 5, the orthographic projection of the overlapped portion on the base substrate 001 is the overlapping region of the first projection region 005c and the orthographic projection of the first power line 003 on the base substrate 001. The width of the portion of the auxiliary connection structure 005 away from the overlapped portion is arranged to be relatively narrow; and therefore, the influence of capacitive coupling on other signal lines provided on the side of the auxiliary connection structure 005 close to the substrate 001 is reduced, for example, the influence of the capacitive coupling on the data lines is reduced.

In at least one embodiment of the present disclosure, the second side surface 005b of the auxiliary connection structure 005 is covered by the blocking structure 004. That is to say, the second side surface 005b of the auxiliary connection structure 005 in the second projection region is covered by the blocking structure 004.

Figure 6:
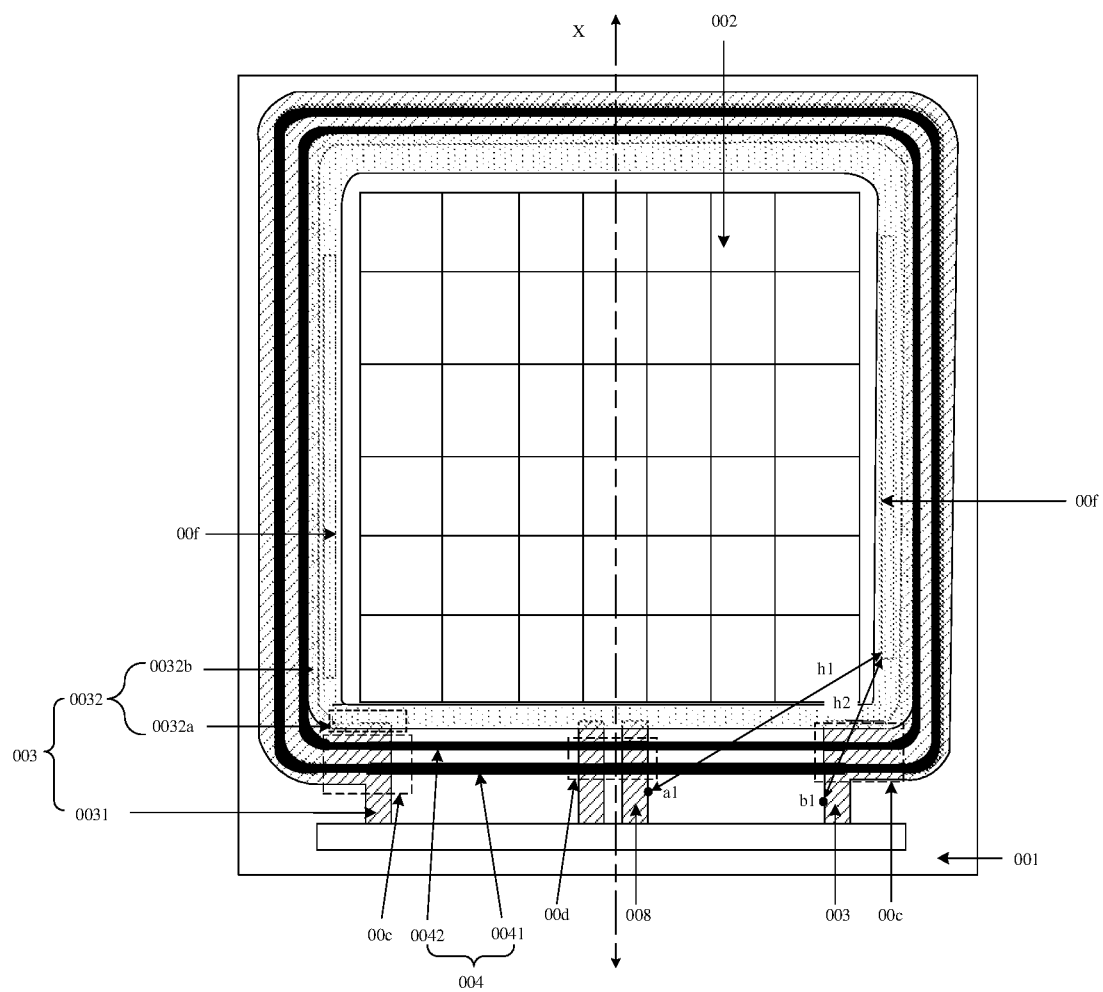
FIG. 6 is still another structural schematic diagram of the display substrate provided by the embodiments of the present disclosure.

By covering the second side surface 005b of the auxiliary connection structure 005 by the blocking structure 004, the region of the base substrate 001 occupied by the auxiliary connection structure 005 and the blocking structure 004 is reduced, so as to facilitate the realization of the narrow frame display substrate. Moreover, a distance between the second projection region 005d of the auxiliary connection structure 005 and the first portion 0031 of the at least one first power line 003 is relatively larger, and the second projection region 005d of the auxiliary connection structure 005 is away from the position of the first line inlet port 00c, and thus the path of introducing water vapor is long; and therefore, even if the second side surface 005b of the auxiliary connection structure 005 is covered by the blocking structure 004, water vapor does not enter the pixel units 002. With reference to FIG. 6, the portion through which the power line passes of the blocking structure 004 is called as the line inlet port, for example, the portion through which the first power line 003 passes is called as the first line inlet port 00c.

With reference to FIG. 1 and FIG. 4, the auxiliary connection structure 005 for example has a ring structure surrounding the plurality of pixel units 002, which is convenient for the cathode layer 006 to be connected with the at least one first power line 003 by the auxiliary connection structure 005, and which guarantees the potential uniformity of the power signal provided for the plurality of pixel units 002 of the display substrate. Thus, the display effect is improved.

With reference to FIG. 1, the display substrate further comprises at least one second power line 008. One end 008a of the at least one second power line 008 is located on the side of the blocking structure 004 away from the plurality of pixel units 002 to receive the power signal, and the other end 008b of the at least one second power line 008 is located between the blocking structure 004 and the plurality of pixel units 002, and is connected with the cathode layer 006 by the auxiliary connection structure 005, so that the second power line 008 provides the power signal to the cathode layer 006.

In the embodiments of the present disclosure, one end 008a of each second power line 008 is located outside the region enclosed by the blocking structure 004, and the other end of each second power line 008 is located in the region enclosed by the blocking structure 004. That is, each second power line 008 passes through the blocking structure 004 to enter the region enclosed by the blocking structure 004. The portion through which the second power line 008 passes is referred to as a second line inlet port 00d.

For example, two second power lines 008 are illustrated in FIG. 1 as an example, the one end 008a of each of the second power lines 008 is connected with the driver chip to receive the power signal provided by the driver chip.

Combining FIG. 1 with FIG. 4, the first organic pattern 007 covers at least a portion of the second side surface 005b of the auxiliary connection structure 005, an orthographic projection of the first organic pattern 007 on the base substrate 001 and an orthographic projection of the at least one second power line 008 on the base substrate 001 overlaps with each other to form a second overlapping region 00e, and the second overlapping region 00e does not overlap with the orthographic projection of the blocking structure 004 on the base substrate 001.

By covering at least a portion of the second side surface 005b of the auxiliary connection structure 005 by the first organic pattern 007, the risk of the second side surface 005b of the auxiliary connection structure 005 being corroded by water vapor or oxygen due to an etching defect is reduced, and it is ensured that the auxiliary connection structure 005 effectively transmits the power signal from the first power line 003. Moreover, the organic material of the first organic pattern 007 for example is the hydrophilic material: by arranging that the second overlapping region 00e does not overlap with the orthographic projection of the blocking structure 004 on the base substrate, that is, the first organic pattern 007 being spaced apart from the blocking structure 004, the water vapor introduced from the end 008a for receiving the power signal of the second power line 008 into the plurality of pixel units 002 through the blocking structure 004 and the first organic pattern 007 is reduced, which ensures the yield of the display substrate.

With reference to FIG. 1, the one end 008a of the at least one second power line 008 is located in the middle of the side of the blocking structure 004 away from the plurality of pixel units 002. For example, the one end 008a of the at least one second power line 008 is located in the middle of the bonding region 00a.

The middle is a position where the longitudinal axis X of the base substrate passes through, and the longitudinal axis X is an axis parallel to the data line on the base substrate 001. A distance between the longitudinal axis X and one side of the display substrate is approximately equal to a distance between the longitudinal axis X and the other side of the display substrate. The one side and the other side are approximately parallel to an extension direction of the data line. For example, an included angle between any one of the two sides of the display substrate approximately parallel to the extension direction of the data line and the extension direction of the data line ranges from 0 degree to 10 degrees.

It should be noted that, "approximately" in the embodiments of the present disclosure refers to that an error range within 15% is allowed. If the distances are "approximately." equal to each other, then a difference between the two distances is no more than 15%. If the extension directions are "approximately" parallel to each other, then the included angle of the two extension directions is between 0 degree and 30 degrees, such as 0 degree to 10 degrees, 0 degree to 15 degrees and so on. If the shapes are "approximately" the same with each other, then the two shapes are of the same type, such as a rectangle, a polyline, an arc, a strip, an "L" type and so on. If the areas are "approximately" the same, then a difference between the two areas does not exceed 15%, etc.

For example, with reference to FIG. 1, the display substrate comprises two second power lines 008. The two second power lines 008 are arranged adjacent to each other in the middle of the side of the blocking structure 004 away from the plurality of pixel units 002. Optionally, the two second power lines 008 are arranged in the middle of the side of the blocking structure 004 away from the plurality of pixel units 002, and are spaced from each other to be symmetrical with each other with the longitudinal axis X of the base substrate as a symmetric axis. The arranging positions of the second power lines 008 are not limited in the embodiment of the present disclosure.

If the two second power lines 008 are arranged adjacent to each other in the middle of the side of the blocking structure 004 away from the plurality of pixel units 002, then the two second power lines 008 for example are of an integral structure.

Exemplarily, in a case that the two second power lines 008 are of the integral structure, that is, in a case that the number of the second power line 008 is one, the end 008a of the second power line 008 is located in the middle of the blocking structure 004 away from the plurality of pixel units 002, for example, in the middle of the bonding region 00a, so that a distance from the end 008a of the second power line 008 to the longitudinal axis X is less than a distance from the end 008a of the second power line 008 to any side of the two sides approximately parallel to the longitudinal axis X of the display substrate.

It should be noted that, in a case that the display substrate provided by the embodiments of the present disclosure is a foldable panel, a folding line of the foldable panel is perpendicular to the longitudinal axis X. For example, the folding line of the foldable panel is a vertical line of the longitudinal axis X and passes through a middle point of the longitudinal axis X.

In at least one embodiment of the present disclosure, the first power line 003 comprises two first portions 0031. The two first portions 0031 are approximately arranged at the edge of the side of the blocking structure 004 away from the plurality of pixel units 002 and are symmetrically arranged with the longitudinal axis X of the base substrate 001 as the symmetrical axis.

In at least one embodiment of the present disclosure, the first power line 003 comprises two first portions 0031. For example, the two first portions 0031 are located on two sides of the longitudinal axis X respectively, such as on two sides of the bonding region 00a respectively.

In at least one embodiment of the present disclosure, the first power line 003 comprises two first portions 0031. For example, the portions of the two first portions 0031 respectively near the first line inlet ports 00c are respectively located on two sides of the display substrate, and are respectively close to the two sides parallel to the longitudinal axis X.

In at least one embodiment of the present disclosure, both the second power line 008 in the middle and the first power line 003 at the edge provide the power signal to the cathode layer 006 in the display substrate at the same time, so as to further alleviate the problem that a potential difference of the power signal loaded on the cathode layer 006 in different regions is large due to voltage drop. A long range uniformity (LRU) of the cathode layer 006 is good, and the display effect is improved.

In at least one embodiment of the present disclosure, both the second power line 008 in the middle and the first power line 003 at the edge provide the power signal to the cathode layer 006 in the display substrate. At the same time, even if the second power line 008 in the middle is added, the design of the second power line 008 in the embodiments of the present disclosure reduces the erosion of water and oxygen very well, which ensures a good encapsulation performance.

It should be noted that, more second power lines 008 for example are arranged for a large-sized display substrate. More second power lines 008 are provided to provide the power signal to the cathode layer 006 to ensure the uniformity of potential in respective regions of the cathode layer 006, and the display effect of the display substrate is improved.

It should also be noted that, in the embodiments of the present disclosure, because both the first power line 003 and the second power line 008 are used to provide the power signal to the cathode layer 006, both the first power line 003 and the second power line 008 are referred to as VSS power line or VSS wire.

In at least one embodiment of the present disclosure, FIG. 2 shows a sectional view of a portion of the first power line 003 entering the region surrounded by the blocking structure 004. A level structure of a portion of the second power line 008 entering the region surrounded by the blocking structure 004 is the same as that of the first power line 003. With reference to FIG. 2, an orthographic projection of the first organic pattern 007 on the base substrate 001 and an orthographic projection of the at least one second power line 008 on the base substrate 001 overlap with each other to form a second overlapping region 00e, and a distance between the second overlapping region 00e and the orthographic projection of the blocking structure 004 on the base substrate 001 is greater than a threshold distance. The threshold distance ranges from 80 microns to 150 microns, such as 90 μm. 100 μm, 110 μm, 120 μm, 130 μm, 140 μm and so on. That is to say; there is a certain distance between the second overlapping region 00e and the blocking structure 004. Thus, it is possible to prevent the first organic pattern 007 from directly contacting with the blocking structure 004 near the second line inlet port 00d of the second power line 008. Furthermore, it is possible to reduce the introduction of water vapor into the pixel units 002 through the first organic pattern 007, and the packaging effect is guaranteed. The threshold distance is a threshold value which is determined in advance through experiments to avoid water vapor entering the pixel units 002. That is, in a case that the distance between the second overlapping region 00e and the blocking structure 004 is greater than the threshold distance, water vapor is difficult to enter the pixel units 002 of the display substrate.

The threshold distance is a threshold value which is determined in advance through experiments to avoid water vapor entering the pixel units 002. That is, in a case that the distance between the second overlapping region 00e and the blocking structure 004 is greater than the threshold distance, water vapor does not enter the pixel units 002 of the display substrate.

With reference to FIG. 4, the display substrate further comprises a row driving region 00f between the blocking structure 004 and the plurality of pixel units 002. A distance between the row driving region 00f and the orthographic projection of the at least one second power line 008 on the base substrate 001 is larger than a distance between the row driving region 00f and an orthographic projection of the at least one first power line 003 on the base substrate 001. For example, a distance between the at least one second power line 008 located in the middle and the row driving region 00f is larger than a distance between the at least one first power line 003 and the row driving region 00f. In order to clearly illustrate the position relationship between the auxiliary connection structure 005 and the blocking structure, the first power line 003, the second power line 008 and the cathode layer 006 are not illustrated in FIG. 4.

Or it is understood that, a minimum value of the distances between respective portions of each second power line 008 and the row driving region 00f is greater than a minimum value of the distances between respective portions of each first power line 003 and the row driving region 00f. For example, with reference to FIG. 6, the distance h1 between a point a1 of the at least one second power line 008 and the row driving region 00f is greater than the distance h2 between a point b1 of the at least one first power line 003 and the row driving region 00f.

For example, the row driving region 00f is provided with a plurality of cascaded shift register units, and the plurality of cascaded shift register units are used to drive the pixel units 002 in the rows.

For example, as shown in FIG. 4 and FIG. 6, the display substrate has two row driving regions 00f, which are respectively arranged on two sides of the plurality of pixel units 002 and are symmetrically arranged with the longitudinal axis X of the base substrate 001 as the symmetrical axis.

Figure 7:
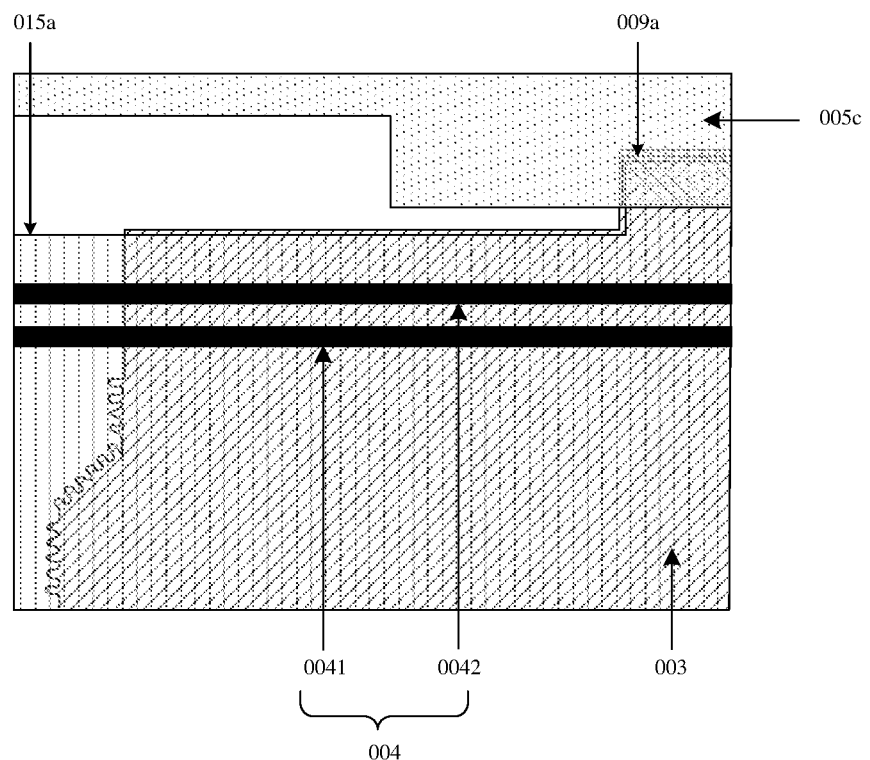
FIG. 7 is still another schematic diagram of a local structure of the display substrate provided by the embodiments of the present disclosure.

In the embodiments of the present disclosure, with reference to FIG. 2, the display substrate further comprises a passivation layer 009, and the passivation layer 009 covers at least one first power line 003. FIG. 7 is another schematic diagram of a local structure of the display substrate provided by embodiments of the present disclosure. The passivation layer 009 is further provided with an opening 009a, a portion of the auxiliary connection structure 005 close to the base substrate 001 is connected with the at least one first power line 003 by the opening 009a, and another portion of the auxiliary connection structure 005 away from the base substrate 001 is connected with the cathode layer 006. The reference 009a shown in FIG. 7 is the opening provided in the passivation layer 009. That is to say, in FIG. 7, except the region where the opening 009a is provided, all other regions are covered by the passivation layer 009.

In the process of preparing the display substrate, the at least one first power line 003 is easy to be corroded by water vapor or oxygen: therefore, by providing the passivation layer 009 to cover the at least one first power line 003, it is ensured that the at least one first power line 003 is not corroded by water vapor or oxygen in the process of forming other layers in subsequent, and the at least one first power line 003 is guaranteed to provide the power signal to the cathode layer 006, so that the display effect of the display substrate is guaranteed.

In the embodiments of the disclosure, the opening in the passivation layer 009 is a hole or a slot, which is not limited in the embodiments of the present disclosure. The material for forming the passivation layer 009 comprises one or more inorganic oxides such as SiNx (silicon nitride), SiOx (silicon oxide) and SiOxNy (silicon nitride). The material of the passivation layer 009 is not limited in the embodiments of the present disclosure.

It should be noted that, in the embodiments of the present disclosure, the passivation layer 009 further covers the at least one second power line 008 to ensure that the at least one second power line 008 is not corroded by water vapor or oxygen, so as to ensure the display effect of the display substrate.

In the embodiments of the present disclosure, with reference to FIG. 1, FIG. 4 and FIG. 6, the blocking structure 004 has a ring structure surrounding the plurality of pixel units 002 to block the overflow of the organic layer in the region enclosed by the blocking structure 004 of the display substrate. Combining FIG. 1 with FIG. 7, the blocking structure 004 comprises a first blocking dam 0041 and a second blocking dam 0042. The first blocking dam 0041 is farther away from the plurality of pixel units 002 than the second blocking dam 0042 is, and a thickness of the first blocking dam 1041 is greater than a thickness of the second blocking dam 0042.

By arranging two blocking dams and the thickness of the first blocking dam 0041 away from the plurality of pixel units 002 is greater than the thickness of the second blocking dam 0042 close to the plurality of pixel units 002, the overflow of the organic layer in the region enclosed by the blocking structure 004 is further prevented. Of course, the blocking structure 004 may comprise one blocking dam or more than two blocking dams, which is not limited in the embodiments of the present disclosure.

Figure 8:
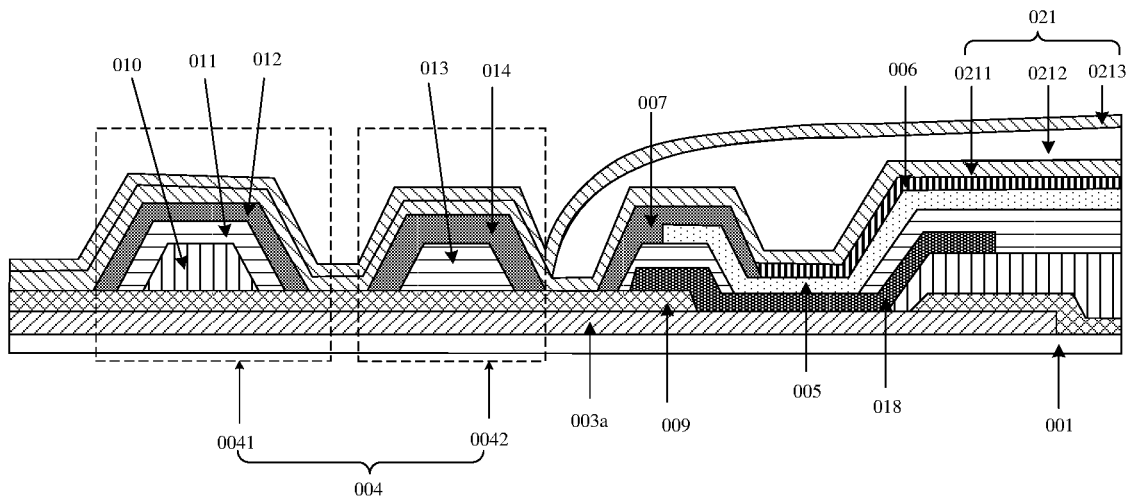
FIG. 8 is still another structural schematic diagram of the display substrate provided by the embodiments of the present disclosure.

As an optional implementation, FIG. 8 is still another structural schematic diagram of the display substrate provided by the embodiments of the present disclosure. With reference to FIG. 8, the first blocking dam 0041 comprises: a first planarization layer pattern 010, a second planarization layer pattern 011, and a second organic pattern 012 arranged in a direction away from the base substrate 001. The second blocking dam 0042 comprises: a third planarization layer pattern 013 and a third organic pattern 014 arranged in the direction away from the base substrate.

The second planarization layer pattern 011 and the third planarization layer pattern 013 for example comprise a same material; and the first organic pattern 007, the second organic pattern 012 and the third organic pattern 014 for example comprise a same material. For example, the second planarization layer pattern 011 and the third planarization layer pattern 013 are made of the same material by a same patterning process. The first organic pattern 007, the second organic pattern 012 and the third organic pattern 014 are made of the same material by a same patterning process.

In the embodiments of the present disclosure, the first planarization layer pattern 010 belongs to a first planarization layer, the second planarization layer pattern 011 and the third planarization layer pattern 013 belong to a second planarization layer, the first organic pattern 007, the second organic pattern 012 and the third organic pattern 014 belong to a first organic layer, and the first organic layer is a pixel definition layer (PDL).

Optionally, the material for forming the first planarization layer, the second planarization layer, and the first organic layer comprises organic material such as resin, which is not limited in the embodiments of the present disclosure.

As an optional implementation, with reference to FIG. 2, the first blocking dam 0041 comprises: a planarization layer pattern 015 and the second organic pattern 012 sequentially stacked in the direction away from the base substrate 001. The second blocking dam 0042 comprises: the third organic pattern 014 arranged on the base substrate 001.

The first organic pattern 007, the second organic pattern 012 and the third organic pattern 014 for example comprise a same material. For example, the first organic pattern 007, the second organic pattern 012 and the third organic pattern 014 are made of the same material by a same patterning process.

In the embodiments of the present disclosure, the planarization layer pattern 015 belongs to a planarization layer, the first organic pattern 007, the second organic pattern 012, and the third organic pattern 014 belong to the first organic layer.

Optionally, the material for forming the planarization layer comprises organic material such as resin, which is not limited in the embodiments of the present disclosure.

It should be noted that, the opening 015a shown in FIG. 7 in a region not covered by the planarization layer pattern 015. For example, in the region shown in FIG. 7, except the region where the opening 015a is provided, all other regions of the base substrate 001 are covered with the planarization layer pattern 015. It is seen from FIG. 7, the planarization layer pattern 015 covers the boundary of the portion of the first power line 003 located in the region surrounded by the blocking structure 004.

Combining FIG. 2 with FIG. 7, the orthographic projection of the at least one first power line 003 on the base substrate 001 and the first projection region 005c overlap with each other to form an overlapping region, an overlapped region between the orthographic projection of the opening 009a of the passivation layer 009 on the base substrate 001 and the overlapping region covers an overlapped region between the orthographic projection of the opening 015a of the planarization layer pattern 015 on the base substrate 001 and the overlapping region. That is, in the overlapping region, the size of the opening 009a of the passivation layer 009 is larger than the size of the opening 015a of the planarization layer pattern 015.

With reference to FIG. 2 and FIG. 8, the first blocking dam 0041 has one more planarization layer pattern than the second blocking dam 0042, so that the thickness of the first blocking dam 0041 is larger than the thickness of the second blocking dam 0042, which prevents the overflow of the organic layer.

Figure 9:
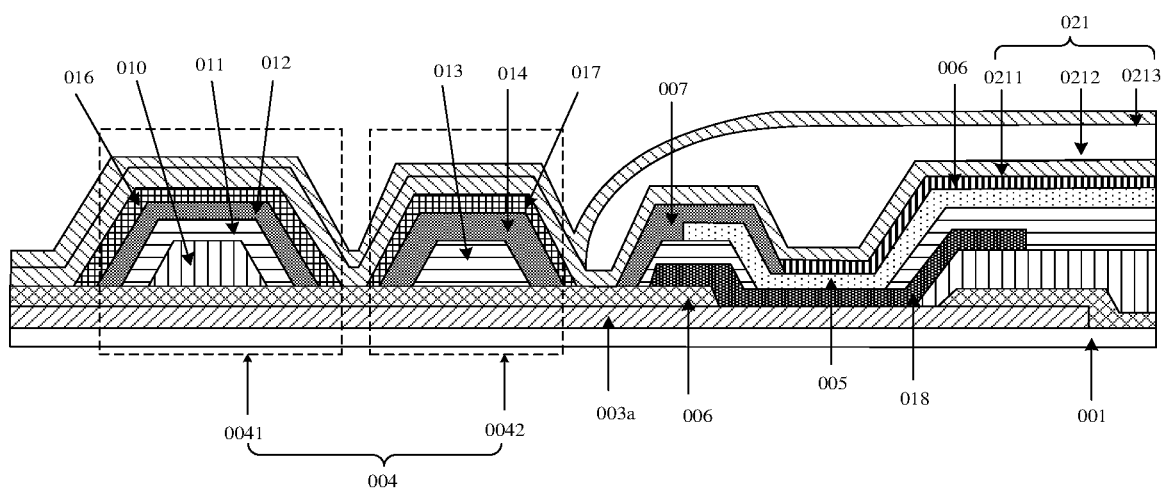
FIG. 9 is still another structural schematic diagram of the display substrate provided by the embodiments of the present disclosure.

FIG. 9 is still another structural schematic diagram of the display substrate provided by the embodiments of the present disclosure. With reference to FIG. 9, the first blocking dam 0041 further comprises: a fourth organic pattern 016 arranged on the side of the second organic pattern 012 away from the base substrate. The second blocking dam 0042 comprises: a fifth organic pattern 017 arranged on the side of the third organic pattern 014 away from the base substrate 001.

The fourth organic pattern 016 and the fifth organic pattern 017 for example comprises a same material. For example, the fourth organic pattern 016 and the fifth organic pattern 017 are made of the same material and manufactured by a same patterning process. Moreover, both the fourth organic pattern 016 and the fifth organic pattern 017 belong to a second organic layer, and the second organic layer is a photosensitive spacer (PS).

Optionally, the material for forming the second organic layer comprises resin or other organic material, which is not limited in the embodiment of the present disclosure.

Figure 10:
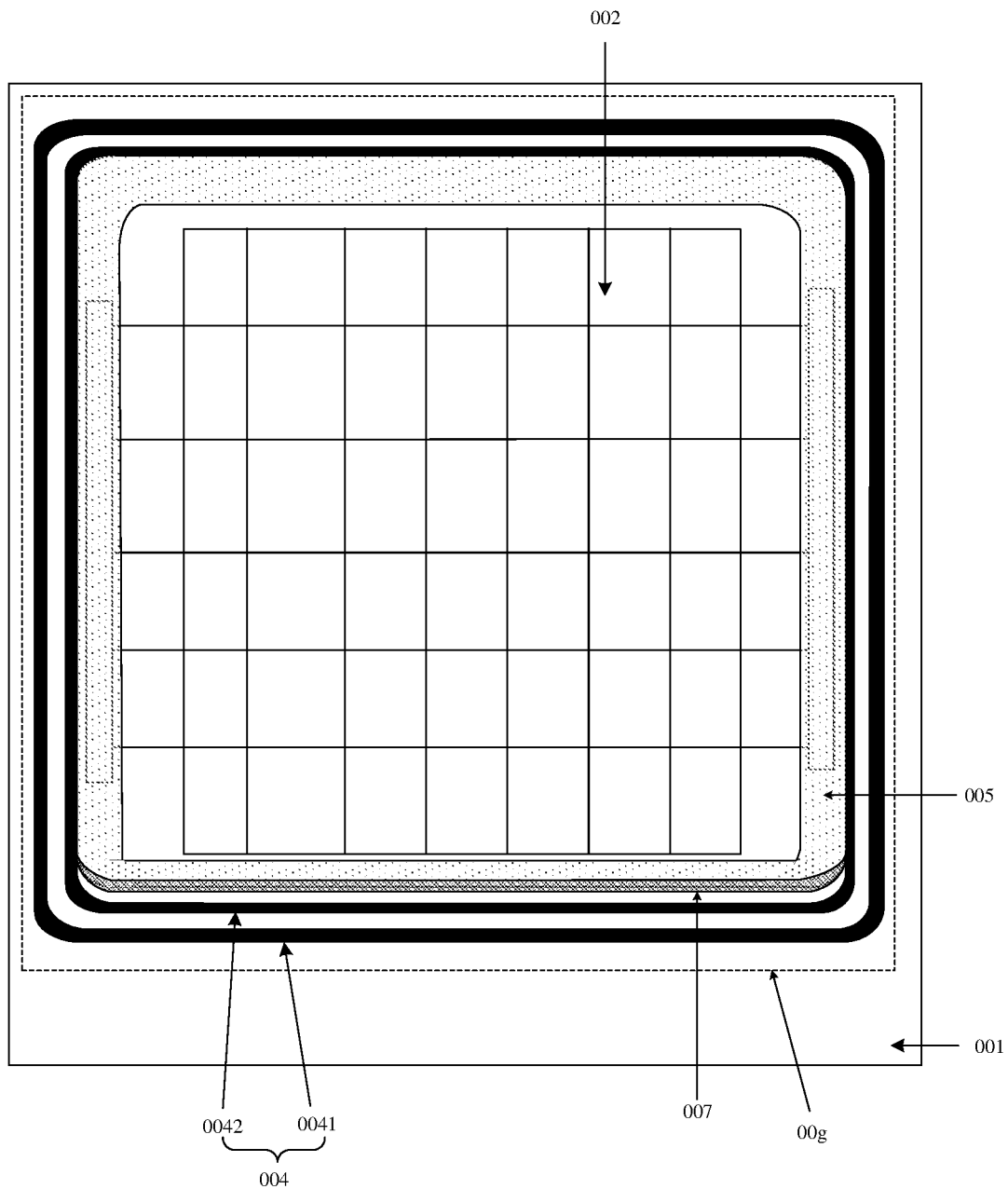
FIG. 10 is still another structural schematic diagram of the display substrate provided by the embodiments of the present disclosure.

FIG. 10 is still another structural schematic diagram of the display substrate provided by the embodiments of the present disclosure. With reference to FIG. 10, the first organic pattern 007 covers the second side surface 005b of the auxiliary connection structure 005. With reference to FIG. 1, FIG. 4, FIG. 6 and FIG. 10, the first blocking dam 0041 is a first ring, and the second blocking dam 0042 is a second ring. The first organic pattern 007 and a portion of the third organic pattern 014 form a third ring, an orthographic projection of the third ring on the base substrate 001 is located inside an orthographic projection of the second ring on the base substrate 001, and the orthographic projection of the second ring on the base substrate 001 is located inside an orthographic projection of the first ring on the base substrate 001; and the third ring surrounds the plurality of pixel units 002. The third ring surrounds the plurality of pixel units 002. The shape of the third organic pattern 014 is approximately the same as that of the second blocking dam 0042, that is, the third organic pattern 014 is also a ring.

The portion of the third organic pattern 014 is a pattern in the third organic pattern 014 located on the side of the first organic pattern 007 close to the plurality of pixel units 002. For example, with reference to FIG. 10, the portion of the third organic pattern 014 is the left portion, the upper portion, and the right portion of the third organic pattern 014.

Figure 11:
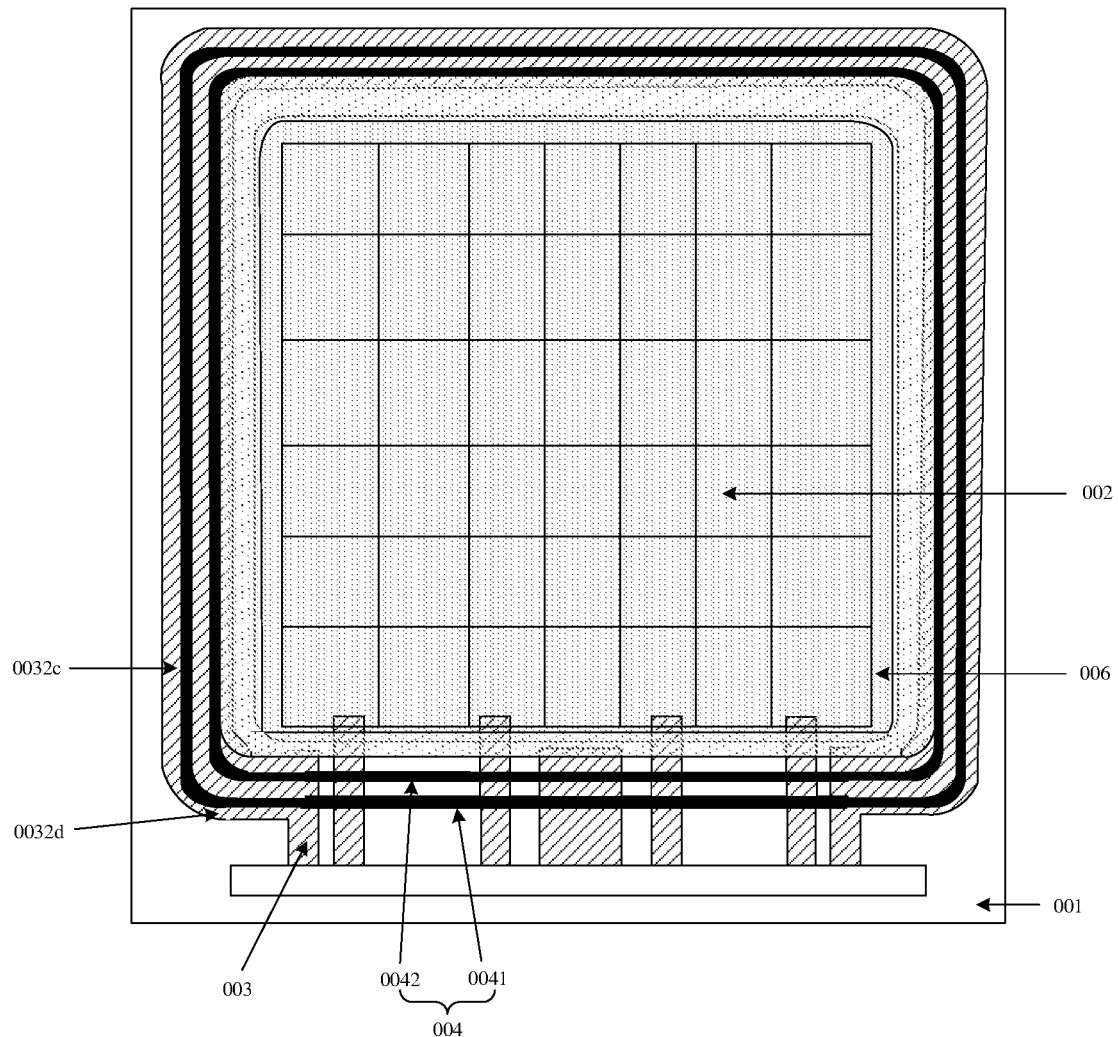
FIG. 11 is still another structural schematic diagram of the display substrate provided by the embodiments of the present disclosure.

In at least one embodiment of the present disclosure, the first organic pattern 007 comprises a portion in direct contact with the second blocking dam 0042. With reference to FIG. 1, FIG. 6 and FIG. 11, the first power line 003 comprises two first portions 0031 and one second portion 0032. The two first portions 0031 are respectively arranged on two sides of the base substrate 001 and are symmetrically arranged with the longitudinal axis X of the base substrate 001 as the symmetrical axis: for example, the portions of the two first portions 0031 respectively near the first line inlet ports 00C are respectively located on two sides of the display substrate, such as near the two sides of the display substrate parallel to the longitudinal axis X. FIG. 4 shows two first line inlet ports 00c of the first portions 0031. The second portion 0032 surrounds the plurality of pixel units 002, and each of two ends of the second portion 0032 is connected with one first portion 0031.

In at least one embodiment of the present disclosure, the first portion 0031 is in direct contact with the second portion 0032, for example, the first portion 0031 and the second portion 0032 are of an integral structure.

In the embodiments of the present disclosure, the second portion 0032 comprises: a straight portion 0032c and an arc-shaped portion 0032d which together surround the region where the plurality of pixel units 002 are located.

In the embodiments of the present disclosure, the second portion 0032 comprises: the straight portion 0032c and the arc-shaped portion 0032d which together surround the region where the plurality of pixel units 002 are located. In addition, the second portion 0032 of the first power line 003 is an unclosed structure, and the embodiments of the present disclosure is described by taking the case that the second portion 0032 surrounds at least two sides of the display substrate as an example. An orthographic projection of the portion of the first organic pattern 007 in direct contact with the second blocking dam 0042 is in an orthographic projection of the arc-shaped portion 0032*d* on the base substrate 001. That is to say, the orthographic projection of the portion of the first organic pattern 007 in direct contact with the second blocking dam 0042 on the base substrate 001 does not exceed the orthographic projection of arc-shaped portion 0032*d* on the base substrate 001.

In the embodiments of the present disclosure, the arc-shaped portion 0032*d* is closer to the first portion 0031 for receiving the power signal of the at least one first power line 003 than the straight portion 0032*c* is.

As an optional implementation, with reference to FIG. 8, the at least one first power line 003 comprises: a first metal layer 003*a*. The display substrate further comprises an auxiliary metal layer 018 located on the side of the first metal layer 003*a* away from the base substrate.

In the embodiments of the present disclosure, the side of the auxiliary metal layer 018 away from the first metal layer 003*a* is in contact with the auxiliary connection structure 005, and the orthographic projection of the auxiliary metal layer 018 on the base substrate 001 overlaps with the orthographic projection of the blocking structure 004 on the base substrate 001. For example, the orthographic projection of the auxiliary metal layer 018 on the base substrate 001 comprises a portion within the region surrounded by the orthographic projection of the blocking structure 004 on the base substrate 001.

Figure 12:
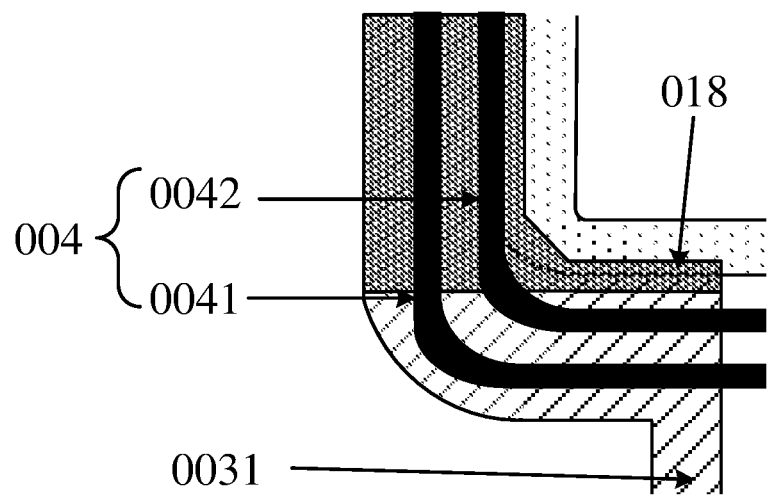
FIG. 12 is still another schematic diagram of a local structure of the display substrate provided by the embodiments of the present disclosure.

FIG. 12 is still another schematic diagram of a local structure of the display substrate provided by the embodiments of the present disclosure. With reference to FIG. 12, the orthographic projection of the auxiliary metal layer 018 on the base substrate 001 comprises a portion located in the orthographic projection of the second blocking dam 0042 on the base substrate 001.

In the embodiments of the present disclosure, in the region where the blocking structure 004 is located, the side of the first metal layer 003*a* away from the base substrate 001 is not provided with the auxiliary metal layer 018, that is, the auxiliary metal layer 018 in the region where the blocking structure 004 is located is removed, that is, the auxiliary metal layer 018 in the region where the first line inlet port 00*c* is located is removed. For example, the auxiliary metal layer 018 is arranged on the side of the blocking structure 004 away from the plurality of pixel units 002, and the auxiliary metal layer 018 is arranged in the region surrounded by the blocking structure 004.

The shape of the boundary of the auxiliary metal layer 018 is approximately the same as that of the first metal layer 003*a*, or the shape of the boundary of the auxiliary metal layer 018 is different from that of the first metal layer 003*a*, which is not limited in the embodiments of the present disclosure.

The power signal received by the first metal layer 003*a* is transmitted to the auxiliary connection structure 005 by the auxiliary metal layer 018 arranged in the opening of the passivation layer 009. The power signal is transmitted to the cathode layer 006 by the auxiliary connection structure 005.

In the embodiments of the present disclosure, with reference to FIG. 8, on the side of the auxiliary metal layer 018 away from the base substrate 001, a portion close to the edge and the side surface of the auxiliary metal layer 018 is covered by the second planarization layer comprising the second planarization layer pattern 011 and the third planarization layer pattern 013, and the second planarization layer is used for avoiding the side wall of the auxiliary metal layer 018 from resulting in poor display due to etching defects.

For example, the organic material for forming the second planarization layer is the hydrophilic material: in order to avoid the auxiliary metal layer 018 introducing water vapor into the pixel units 002, the orthographic projection of the auxiliary metal layer 018 on the base substrate 001 does not overlap with the orthographic projection of the blocking structure 004 on the base substrate 001, and the path of water vapor entering from the blocking structure 004 to the region where the pixel units 002 are located through the second planarization layer is blocked, thus the display effect of the display substrate is guaranteed.

Figure 13:
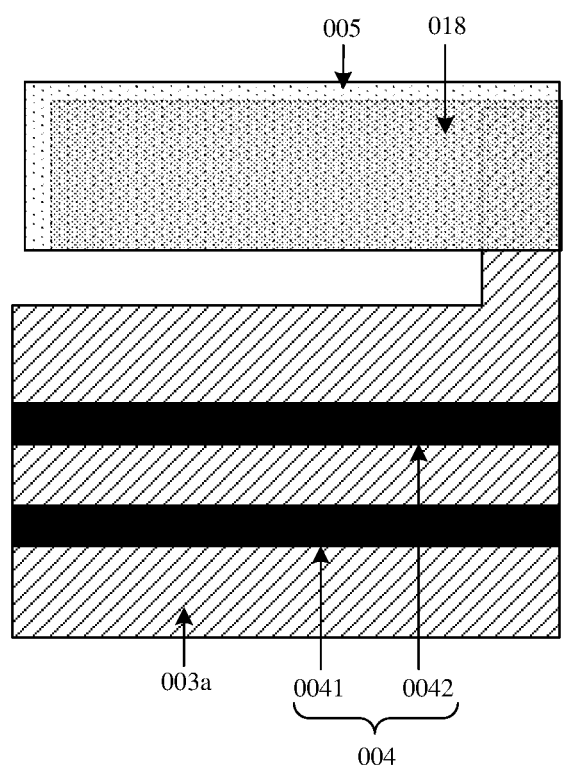
FIG. 13 is still another schematic diagram of a local structure of the display substrate provided by the embodiments of the present disclosure.
Figure 14:
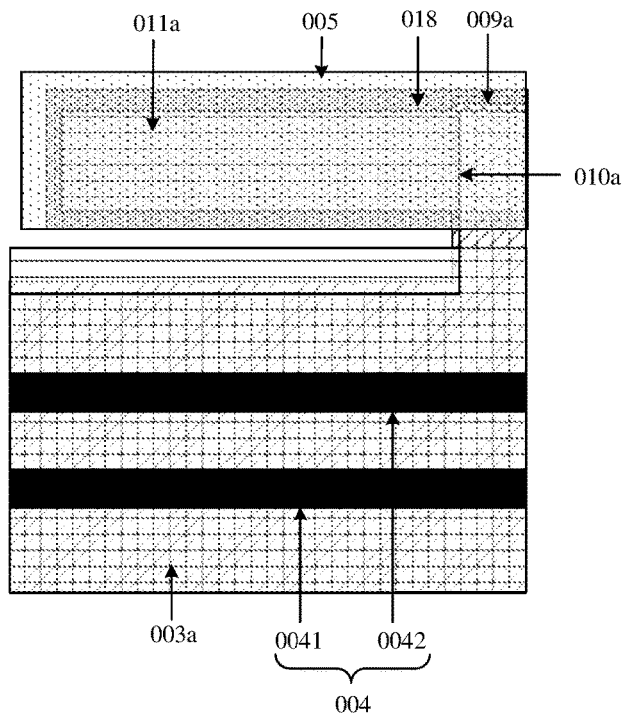
FIG. 14 is still another schematic diagram of a local structure of the display substrate provided by the embodiments of the present disclosure.

FIG. 13 is still another schematic diagram of a local structure of the display substrate provided by the embodiments of the present disclosure. With reference to FIG. 13, the orthographic projection of the portion that the auxiliary metal layer 018 is in contact with the first metal layer 003*a* on the base substrate 001 is located in the orthographic projection of the auxiliary metal layer 018 on the base substrate 001, thus, a space is provided between the boundary of the first metal layer 003*a* and the boundary of the auxiliary metal layer 018, which prevents the first metal layer 003*a* and the auxiliary metal layer 018 from being corroded by water vapor or oxygen. FIG. 14 is still another schematic diagram of a local structure of the display substrate provided by the embodiments of the present disclosure. The reference 010*a* shown in FIG. 14 is an opening provided in the first planarization layer. That is to say, in FIG. 14, except the region where the opening 010*a* is located, all other regions are covered by the first planarization layer. The reference 011*a* shown in FIG. 14 is an opening provided in the second planarization layer. That is to say, in FIG. 14, except the region where the opening 011*a* is located, all other regions are covered with the second planarization layer.

In this implementation, the first metal layer 003*a*, the passivation layer 009, the first planarization layer pattern 010, the auxiliary metal layer 018, the second planarization layer pattern 011, and the first organic pattern 007 in the display substrate are stacked in the direction away from the base substrate 001. That is to say, the first power line 003, the passivation layer 009, the first planarization layer, the auxiliary metal layer 018, the second planarization layer, and the first organic layer in the display substrate are stacked in the direction away from the base substrate 001.

It should be noted that, each of the first metal layer 003*a* and the auxiliary metal layer 018 comprises three layers of metal, for example, the three layers of metal sequentially is titanium (TI), aluminum (AL) and Ti.

Figure 15:
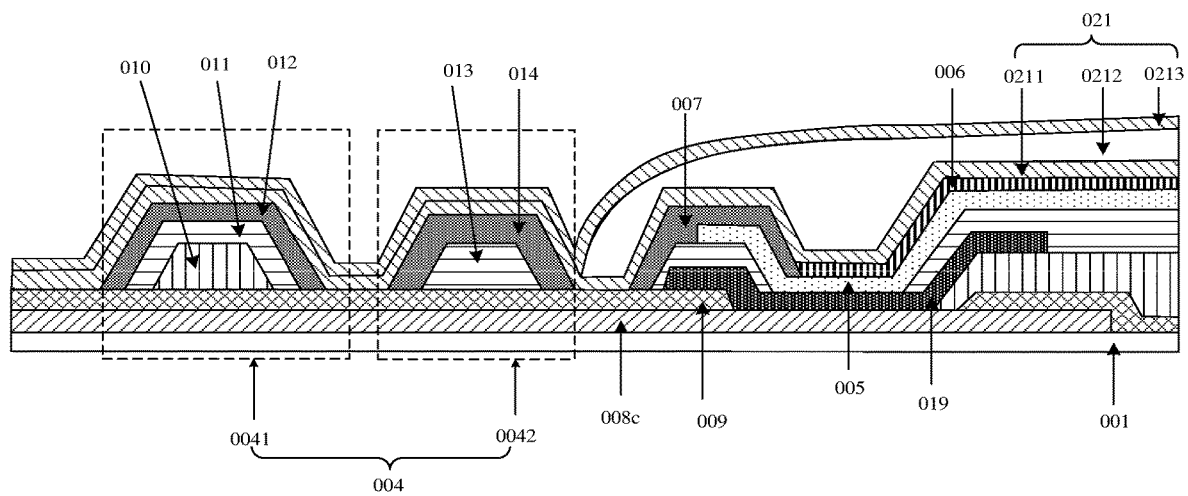
FIG. 15 is a cross-sectional structural schematic diagram of the display substrate shown in FIG. 1 taken along a CC line.

It should also be noted that, FIG. 15 is a cross-sectional structural schematic diagram of the display substrate shown in FIG. 1 along a CC line. With reference to FIG. 15, the at least one second power line 008 comprises: a second metal layer 008*c*. The display substrate further comprises an auxiliary wiring layer 019 located on the side of the second metal layer 008*c* away from the base substrate 001.

In the embodiments of the present disclosure, the side of the auxiliary wiring layer 019 away from the second metal layer 008*c* is in contact with the auxiliary connection structure 005, and an orthographic projection of the auxiliary wiring layer 019 on the base substrate 001 does not overlap with the orthographic projection of the blocking structure 004 on the base substrate 001. For example, the orthographic projection of the auxiliary wiring layer 019 on the base substrate 001 comprises a portion in a region surrounded by the orthographic projection of the blocking structure 004 on the base substrate 001.

Figure 16:
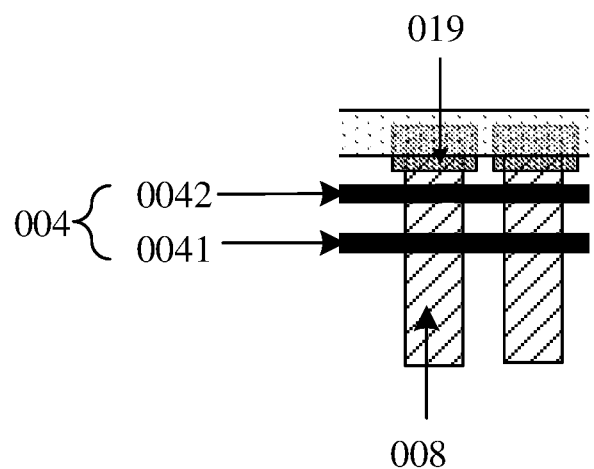
FIG. 16 is still another schematic diagram of a local structure of the display substrate provided by the embodiments of the present disclosure.

FIG. 16 is still another schematic diagram of a local structure of the display substrate provided by the embodiments of the present disclosure. With reference to FIG. 16, the orthographic projection of the auxiliary wiring layer 019 on the base substrate 001 comprises a portion in the region surrounded by the orthographic projection of the second blocking dam 0042 on the base substrate 001.

In the embodiments of the present disclosure, in the region where the blocking structure 004 is located, the side of the second metal layer 008*c* away from the base substrate 001 is not provided with the auxiliary wiring layer 019, that is, the auxiliary wiring layer 019 in the region where the blocking structure 004 is located is removed, that is, the auxiliary wiring layer 019 in the region where the second line inlet port 00*d* is located is removed. For example, the auxiliary wiring layer 019 is arranged on the side of the blocking structure 004 away from the plurality of pixel units, and the auxiliary wiring layer 019 is arranged in a region comprised by the blocking structure 004.

The shape of the boundary of the auxiliary wiring layer 019 is approximately the same as the shape of the boundary of the second metal layer 008*c*, or the shape of the boundary of the auxiliary wiring layer 019 is different from the shape of the boundary of the second metal layer 008*c*, which is not limited in the embodiments of the present disclosure.

Figure 17:
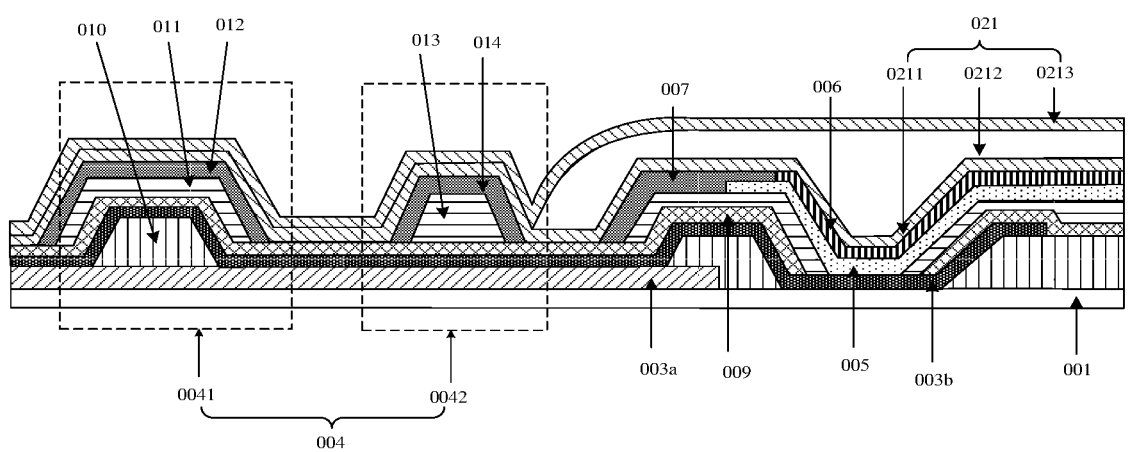
FIG. 17 is still another structural schematic diagram of the display substrate provided by the embodiments of the present disclosure.

As an optional implementation, with reference to FIG. 17, the at least one first power line 003 comprises the first metal layer 003*a* and a third metal layer 003*b* arranged in the direction away from the base substrate 001. The side of the third metal layer 003*b* away from the first metal layer 003*a* contacts with the auxiliary connection structure 005.

Both the orthographic projection of the first metal layer 003*a* on the base substrate 001 and the orthographic projection of the third metal layer 003*b* on the base substrate 001 overlap with the orthographic projection of the blocking structure 004 on the base substrate 001. That is, the first metal layer 003*a* and the third metal layer 003*b* of the first portion 0031 away from the plurality of pixel units 002 are both used to receive the power signal, and thus the power signal is transmitted to the cathode layer 006 through the two metal layers comprising the first metal layer 003*a* and the third metal layer 003*b*, and the resistance is reduced, thereby the voltage drop of the power signal is reduced.

With reference to FIG. 17, the orthographic projection of the first metal layer 003*a* on the base substrate 001 does not overlap with the region that the third metal layer 003*b* is in contact with the auxiliary connection structure 005.

Figure 18:
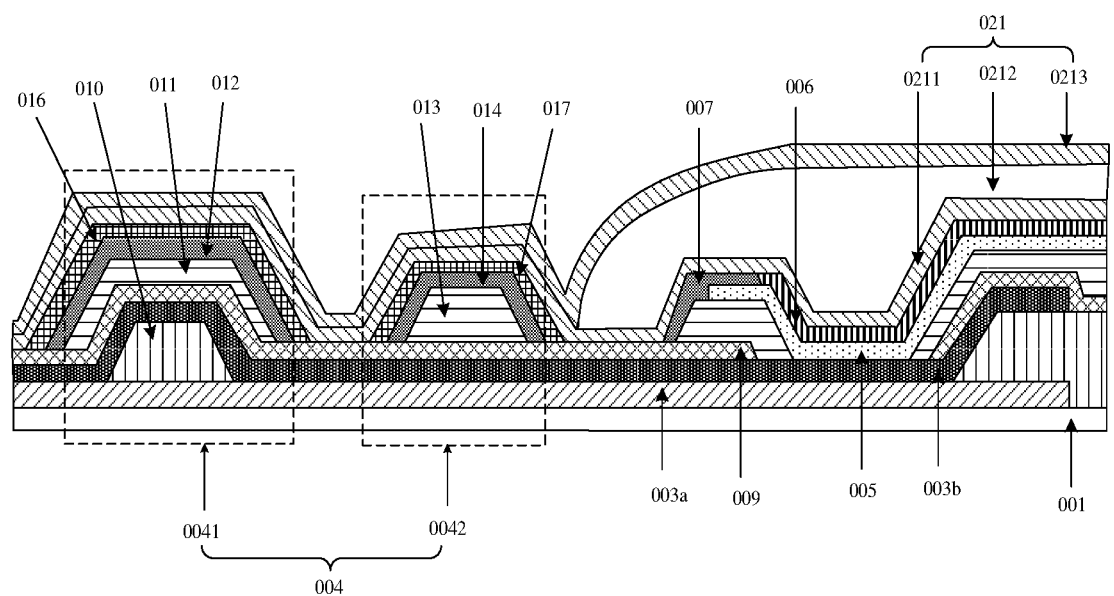
FIG. 18 is still another structural schematic diagram of the display substrate provided by the embodiments of the present disclosure.

Optionally, with reference to FIG. 18, the orthographic projection of the first metal layer 003*a* on the base substrate 001 overlaps with the region that the third metal layer 003*b* is in contact with the auxiliary connection structure 005.

The first planarization layer covers the other end of the first metal layer 003*a* close to the plurality of pixel units 002, which reduces the corrosion of the other end of the first metal layer 003*a* by oxygen or water vapor, or reduces the final display defect caused by the etching defect on the side of the metal layer.

With reference to FIG. 17 and FIG. 18, the first metal layer 003*a*, the first planarization layer pattern 010, the third metal layer 003*b*, the passivation layer 009, the second planarization layer pattern 011, and the first organic pattern 007 are stacked in the direction away from the base substrate 001. That is to say; the first metal layer pattern 003*a*, the first planarization layer, the third metal layer 003*b*, the passivation layer 009, the second planarization layer, and the first organic layer in the display substrate are stacked in the direction of the base substrate 001.

It should be noted that, each of the first metal layer 003*a* and the third metal layer 003*b* for example comprises three layers of metal, for example, the three layers of metal are Ti, Al and Ti in sequence.

It should also be noted that, with reference to FIG. 9 and FIG. 18, the first blocking dam 0041 further comprises the fourth organic pattern 016 arranged on the side of the second organic pattern 012 away from the base substrate, and the second blocking dam 0042 comprises the fifth organic pattern 017 arranged on the side of the third organic pattern 014 away from the base substrate 001: in this case, the second organic layer comprising the fourth organic pattern 016 and the fifth organic pattern 017 is arranged on the side of the first organic layer away from the base substrate 001.

Figure 19:
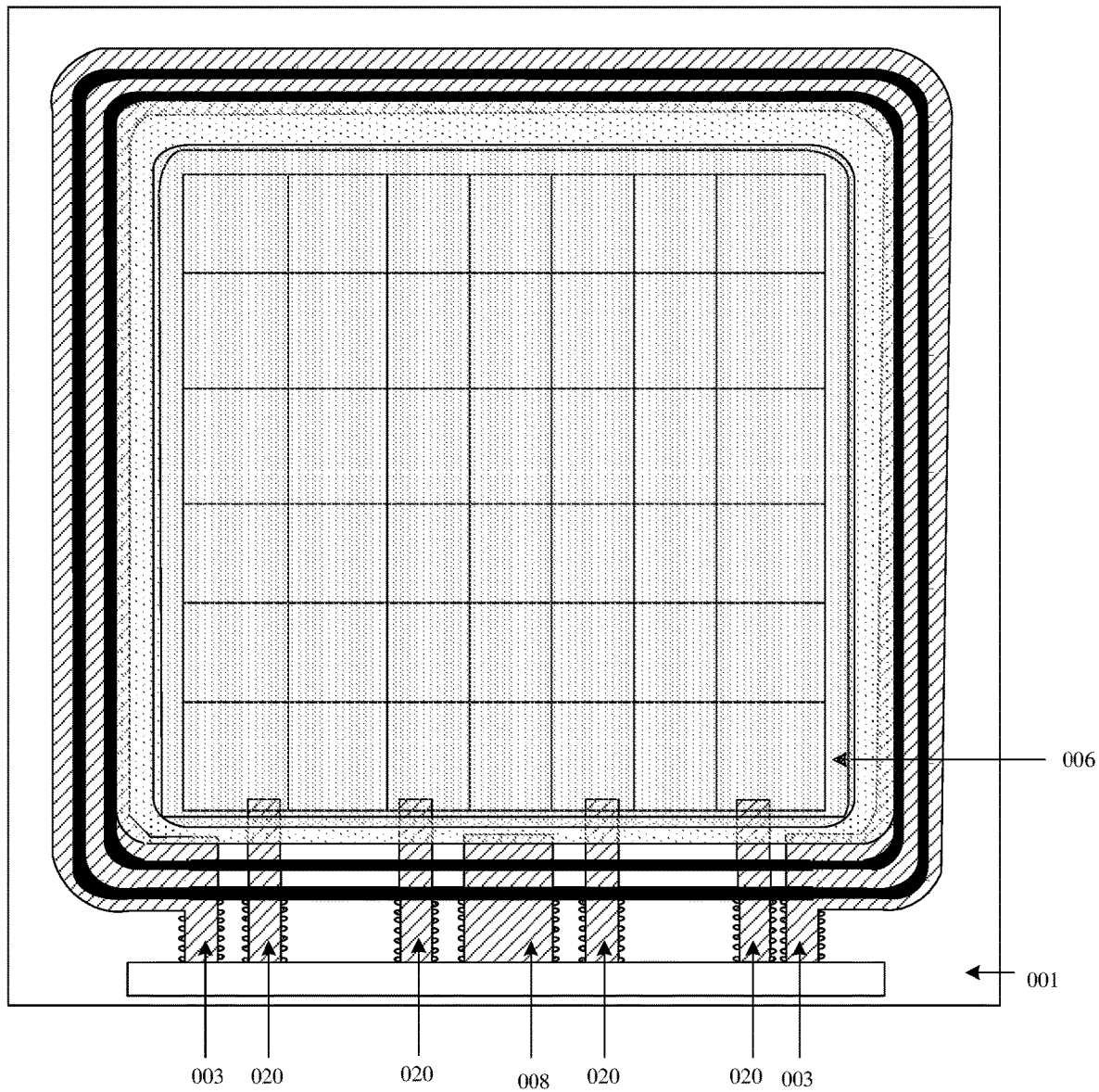
FIG. 19 is still another structural schematic diagram of the display substrate provided by the embodiments of the present disclosure.

FIG. 19 is still another structural schematic diagram of the display substrate provided by the embodiments of the present disclosure. With reference to FIG. 5 and FIG. 19, a side surface of one end of the first portion 0031 of the at least one first power line 003 located on the side of the blocking structure 004 away from the plurality of pixel units 002 has a plurality of tooth-shaped convex structures, so as to further extend the path of introducing the water vapor and avoid water vapor from being introduced into the plurality of pixel units 002.

With reference to FIG. 5 and FIG. 19, orthographic projections of the convex structures on the base substrate 001 do not overlap with the orthographic projection of the blocking structure 004 on the base substrate 001. Moreover, the side surface of the other end of the first portion 0031 of the at least one first power line 003 located in the region enclosed by the blocking structure 004 is a plane, that is, the side surface of the other end of the first portion 0031 of the at least one first power line 003 located in the region enclosed by the blocking structure 004 is not formed with convex structures.

During manufacturing the display substrate, the auxiliary connection structure 005 is prepared by sequentially performing exposure, development, etching and other processes. In the process of etching, etchant is employed to etch the film: if the side surface of the other end of the first portion of the at least one first power line located in the region enclosed by the blocking structure 004 is also provided with a plurality of tooth-shaped convex structures, then the etchant easily remains between the adjacent convex structures of the first power line 003, so that the side surface of the other end of the first portion 0031 of the first power line 003 is corroded. Therefore, the side surface of the other end of the first portion 0031 of the first power line 003 in the region enclosed by the blocking structure 004 is arranged as a plane, so that during the process of manufacturing the display substrate, the problem that the passivation layer 009, which is relatively brittle, on the side of the first power line 003 away from the base substrate 001 is pierced due to that the side surface of the first power line 003 is corroded is avoided, and the quality of the passivation layer 009 is guaranteed.

With reference to FIG. 19, a side surface of the end of the at least one second power line 008 away from the plurality of pixel units 002 has a plurality of tooth-shaped convex structures, which extends the path of introducing water vapor along the second power line 008 and avoids water vapor from being introduced into the plurality of pixel units 002. Moreover, the side surface of the other end 008*b* of the at least one second power line 008 in the region enclosed by the blocking structure 004 is a plane.

With reference to FIG. 19, it is seen that the display substrate further comprises: a plurality of third power lines 020, which are located on the base substrate 001. The plurality of third power lines 020 are electrically connected with transistors in the pixel units 002 of the display substrate. For example, the third power lines 020 are respectively connected with a source electrode or a drain electrode of the corresponding transistors in the pixel units 002. The third power lines 020 are used to provide positive power signal to the transistors in the pixel units 002, so that the third power lines 020 are called as VDD power lines or VDD wires.

In the embodiments of the present disclosure, the plurality of third power lines 020 are symmetrically arranged on two sides of the at least one second power line 008. For example, with reference to FIG. 19, the display substrate comprises four third power lines 020, two third power lines 020 are located in the middle of the side of the blocking structure 004 away from the plurality of pixel units 002, and the two third power lines 020 are symmetrically arranged on two sides of the second power line 008 with the longitudinal axis X of the base substrate 001 as the symmetrical axis. The remaining two third power lines 020 are located at the edge of the side of the blocking structure away from the plurality of pixel units 002, and each of the remaining two third power lines 020 is located on the side of the first portion 0031 of the first power line 003 close to the second power line 008.

With reference to FIG. 19, the side surface of the end of each of the plurality of third power lines 020 located on the side of the blocking structure 004 away from the plurality of pixel units 002 is also provided with a plurality of tooth-shaped convex structures, so that the paths of introducing water vapor along the third power lines 020 are extended to avoid water vapor from being introduced into the plurality of pixel units 002. Moreover, the side surface of the other end of each of the third power lines 0200 located in the region enclosed by the blocking structure 004 is a plane.

With reference to FIG. 2, FIG. 8 to FIG. 9, FIG. 15, and FIG. 17 to FIG. 18, the display substrate further comprises an encapsulation layer 021. The encapsulation layer 021 is located on a side of the plurality of first power lines away from the base substrate 001, and the encapsulation layer 021 covers the region enclosed by the blocking structure 004. With reference to FIG. 10, the boundary of the region 00g covered by the encapsulation layer 021 is located on the side of the blocking structure 004 away from the plurality of pixel units 002.

In the embodiments of the present disclosure, the encapsulation layer 021 comprises: a first layer 0211, a second layer 0212 and a third layer 0213 which are stacked in the direction away from the base substrate 001.

Optionally, the first layer 0211 and the third layer 0213 are made of an inorganic material, and the second layer 0212 is made of an organic material. For example, the first layer 0211 and the third layer 0213 are made of one or more inorganic oxides such as SiNx, SiOx and SiOxNy. The second layer 0212 is made of a resin material. The resin material is a thermoplastic resin or a thermosetting resin, the thermoplastic resin comprises acrylic (PMMA) resin, and the thermosetting resin comprises epoxy resin.

It should be noted that, the second layer 0212 is located in the region enclosed by the blocking structure 004, the first layer 0211 and the third layer 0213 cover the region enclosed by the blocking structure 004 and further cover the blocking structure 004. That is to say, the orthographic projection of the blocking structure 004 on the base substrate 001 is located in the region covered by the encapsulation layer 021, which ensures that the encapsulation layer 021 effectively encapsulates respective structures located in the region enclosed by the blocking structure 004.

In the embodiments of the present disclosure, for example, the second layer 0212 is prepared by an ink jet printing (IJP) method, the first layer 0211 and the third layer 0213 are fabricated by a chemical vapor deposition (CVD) method.

Figure 20:
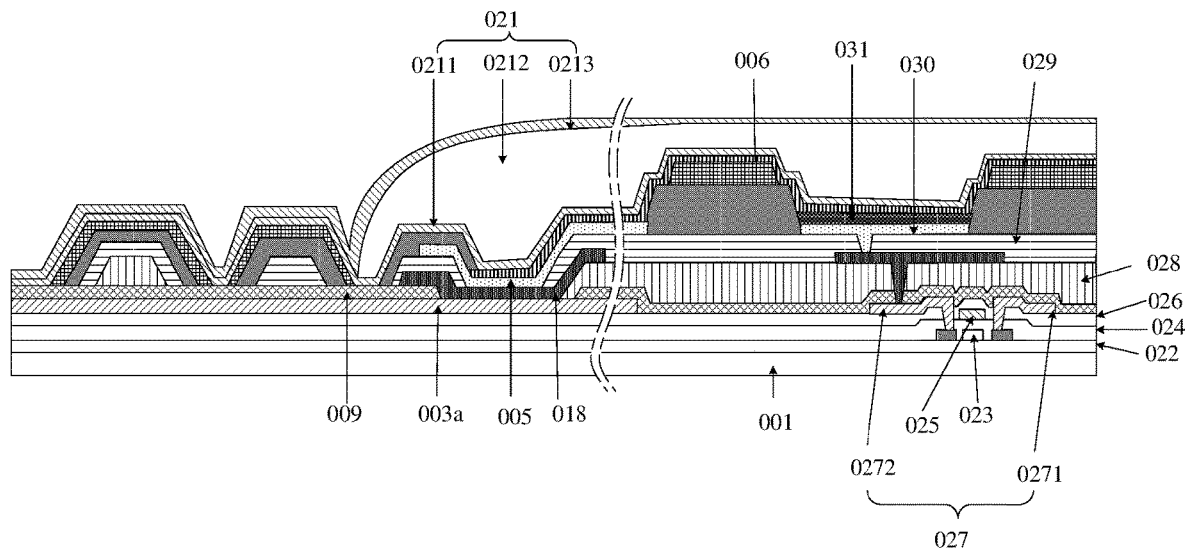
FIG. 20 is still another structural schematic diagram of the display substrate provided by the embodiments of the present disclosure.

FIG. 20 is still another structural schematic diagram of the display substrate provided by the embodiments of the present disclosure. With reference to FIG. 20, it is seen that a buffer layer 022, a semiconductor layer 023, a gate insulation layer 024, a gate electrode 025, an interlayer dielectric layer 026 and a source-drain electrode layer 027 are arranged on the base substrate 001 in sequence, and the source-drain electrode layer 027 comprises a source electrode 0271 and a drain electrode 0272. The source electrode 0271 and the drain electrode 0272 are spaced apart from each other and are respectively connected to the semiconductor layer 023 through via holes. The passivation layer 009, the first planarization layer 028, the second planarization layer 029, and a light-emitting element are arranged on the source-drain electrode layer 027 along the direction away from the base substrate 001. The light-emitting element comprises an anode layer 030, a light-emitting layer 031 and the cathode layer 006 which are stacked in sequence. The anode layer 030 is electrically connected with the drain electrode 0272 through a via hole. The gate electrode 025, the source electrode 0271 and the drain electrode 0) 272 constitute the transistor, and each light-emitting element and the transistor to which the light-emitting element is connected form the pixel unit 002.

With reference to FIG. 20, it is seen that the first metal layer 003a included in the first power line 003 is arranged in a same layer as the source-drain electrode layer 027. The auxiliary connection structure 005 is arranged in a same layer as the anode layer 030 of the pixel unit. The auxiliary connection structure 005 for example comprises three layers, for example, the materials of the three layers are indium tin oxide (ITO), silver (Ag), and ITO in sequence.

Figure 21:
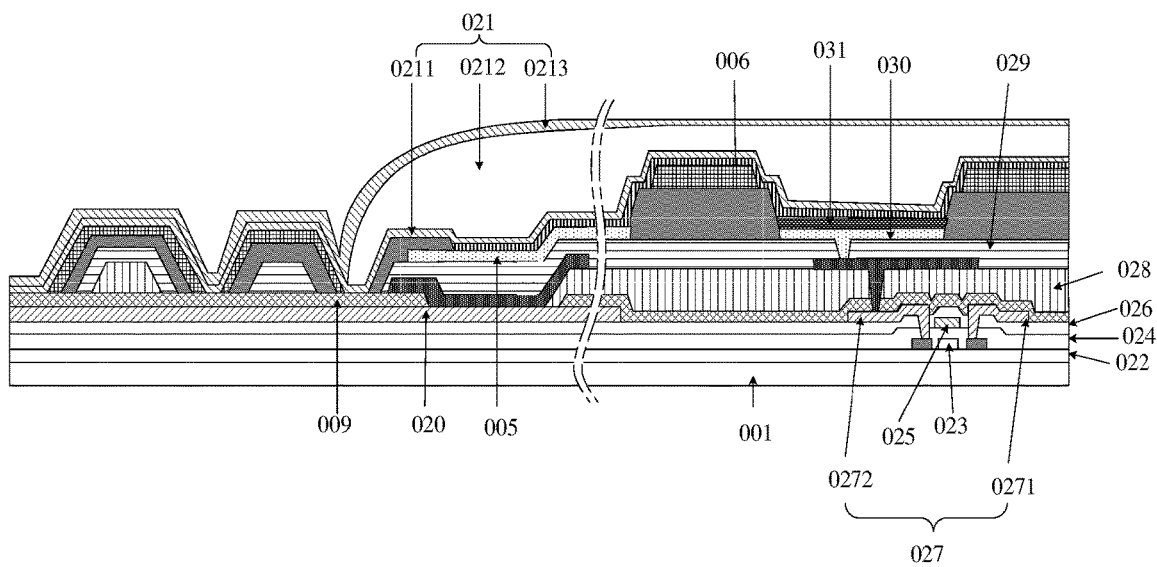
FIG. 21 is still another structural schematic diagram of the display substrate provided by the embodiments of the present disclosure.

With reference to FIG. 19, it is seen that an orthographic projection of at least one of the plurality of third power lines 020 on the base substrate 001 is adjacent to an orthographic projection of the first power line 003 on the base substrate 001. FIG. 21 is still another structural schematic diagram of the display substrate provided by the embodiments of the present disclosure. With reference to FIG. 21, orthographic projections of the plurality of third power lines 020 on the base substrate 001 have an overlapping region with the orthographic projection of the auxiliary connection structure 005 on the base substrate 001, and in the overlapping region, the passivation layer 009 is arranged between the plurality of third power lines 020 and the auxiliary connection structure 005. In addition, the plurality of third power lines 020 are not in contact with the auxiliary connection structure 005.

In summary, the embodiments of the disclosure provides the display substrate, and the display substrate comprises the base substrate, the plurality of pixel units, the at least one first power line, the blocking structure, the auxiliary connection structure, the cathode layer, and the first organic pattern. By arranging the distance between the first connection position closer to the first portion of the at least one first power line and the blocking structure to be larger, the water vapor introduced from the first portion of the first power line into the plurality of pixel units through the hydrophilic material in the blocking structure is reduced, which ensures the yield of the display substrate, and thus the display effect of the display substrate is guaranteed.

Figure 22:
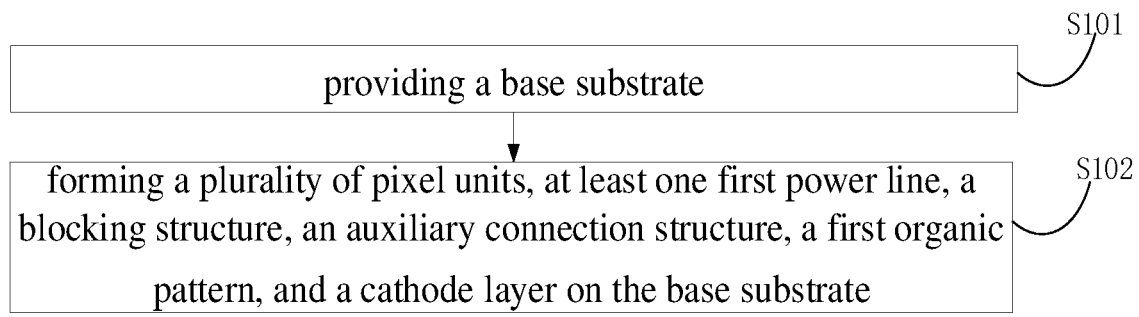
FIG. 22 is a flow chart of a manufacturing method of a display substrate provided by the embodiments of the present disclosure.

FIG. 22 is a flow chart of a manufacturing method of the display substrate provided by the embodiments of the present disclosure. The method is used for manufacturing the display substrate provided by the embodiments. With reference to FIG. 22, the method comprises:

Step 101: providing the base substrate.

Step 102: forming the plurality of pixel units, the at least one first power line, the blocking structure, the auxiliary connection structure, the first organic pattern, and the cathode layer on the base substrate.

The at least one first power line 003 comprises the first portion 0031 and the second portion 0032, the first portion 0031 is located on the side of the blocking structure 004 away from the plurality of pixel units 002, the first portion 0031 is configured for receiving the power signal, and the second portion 0032 is connected with the cathode layer 006 by the auxiliary connection structure 005.

The second portion 0032 has the first connection position 0032a and the second connection position 0032b, the second portion 0032 is connected with the auxiliary connection structure 005 at both the first connection position 0032a and the second connection position 0032b, and the distance between the first connection position 0032a and the blocking structure 004 is larger than the distance between the second connection position 0032b and the blocking structure 004.

It should be noted that, in the above step 102, for example, the at least one first power line 003 is formed on the base substrate 001 firstly, then the blocking structure 004 and the auxiliary connection structure 005 is formed on the side of the first power line 003 away from the base substrate 001, then the first organic pattern 007 is formed on the side of the auxiliary connection structure 005 away from the base substrate 001, and finally the cathode layer 006 is formed on the side of the first organic pattern 007 away from the base substrate 001.

The at least one first power line 003 for example is formed in a same patterning process as the source electrode and the drain electrode of the thin film transistor in the pixel unit 002. The blocking structure 004 for example is formed in the process of forming the planarization layer, the pixel definition layer and the photosensitive spacer. The first organic pattern 007 for example is formed in the process of forming the pixel definition layer. The auxiliary connection structure 005 for example is formed in a same patterning process as the anode layer 030 in the pixel unit 002.

To sum up, the embodiments of the disclosure provide the manufacturing method of the display substrate, and the method comprises forming the plurality of pixel units, the at least one first power line, the blocking structure, the auxiliary connection structure, the first organic pattern, and the cathode layer on the base substrate in sequence. By arranging the distance between the first connection position closer to the first portion of the at least one first power line and the blocking structure to be larger, the water vapor introduced from the first portion of the first power line into the plurality of pixel units through the hydrophilic material in the blocking structure is reduced, which ensures the yield of the display substrate, and thus the display effect of the display substrate is guaranteed.

The embodiments of the present disclosure further provide a display device, and the display device comprises any one of the display substrates according to the above embodiments. The display device is a foldable display device, for example, a liquid crystal display panel, an electronic paper, an organic light-emitting diode (OLED) panel, an active-matrix organic light-emitting diode (AMOLED) panel, a mobile phone, a tablet computer, a TV, a display, a notebook computer, a digital photo frame, a navigator and other products or components with a display function.

The above are only optional embodiments of the present disclosure and do not limit the present disclosure. Any modification, equivalent replacement, or improvement made within the spirit and principle of the present disclosure shall be included in the protection scope of the present disclosure.

What is claimed is:

1. A display substrate, comprising:
a base substrate;
a plurality of pixel units, wherein the plurality of pixel units are located on the base substrate;
a blocking structure, wherein the blocking structure surrounds the plurality of pixel units;
an auxiliary connection structure, comprising a first side surface and a second side surface which are opposite to each other, wherein the first side surface is closer to the plurality of pixel units than the second side surface;
a cathode layer, located on a side of the auxiliary connection structure away from the base substrate;
a first organic pattern, located on the side of the auxiliary connection structure away from the base substrate;
at least one first power line, located on the base substrate, wherein the at least one first power line comprises a first portion, a second portion and a first metal layer, wherein the first portion is located on a side of the blocking structure away from the plurality of pixel units and is configured to receive a power signal, the second portion is connected with the cathode layer by the auxiliary connection structure, and the second portion has a first connection position and a second connection position, the second portion is connected with the auxiliary connection structure at both the first connection position and the second connection position, and a distance between the first connection position and the blocking structure is greater than a distance between the second connection position and the blocking structure;
wherein the at least one first power line further comprises a second metal layer located on a side of the first metal layer away from the base substrate, and a side of the second metal layer away from the first metal layer is in contact with the auxiliary connection structure; or
wherein the display substrate further comprises an auxiliary metal layer located on a side of the first metal layer away from the base substrate, and a side of the auxiliary metal layer away from the first metal layer is in contact with the auxiliary connection structure.

2. The display substrate according to claim 1, wherein the display substrate comprises a bonding region, the bonding region is located on the side of the blocking structure away from the plurality of pixel units, and the first connection position is closer to the bonding region than the second connection position.

3. The display substrate according to claim 1, wherein an orthographic projection of the auxiliary connection structure on the base substrate comprises a first projection region and a second projection region, the first projection region does not overlap with an orthographic projection of the blocking structure on the base substrate, and the second projection region overlaps with the orthographic projection of the blocking structure on the base substrate to obtain a first overlapping region; and
the first projection region is closer to the first portion than the second projection region.

4. The display substrate according to claim 1, wherein the first organic pattern covers at least a portion of the second side surface.

5. The display substrate according to claim 4, wherein the second side surface comprises a portion covered by the first organic pattern and the blocking structure.

6. The display substrate according to claim 1, wherein the auxiliary connection structure has a ring structure surrounding the plurality of pixel units.

7. The display substrate according to claim 1, wherein
the display substrate further comprises: at least one second power line;
one end of the at least one second power line is located on the side of the blocking structure away from the plurality of pixel units to receive the power signal, and the other end of the at least one second power line is located between the blocking structure and the plurality of pixel units and is connected with the cathode layer by the auxiliary connection structure;
an orthographic projection of the first organic pattern on the base substrate overlaps with an orthographic projection of the at least one second power line on the base substrate to obtain a second overlapping region, and the second overlapping region does not overlap with the orthographic projection of the blocking structure on the base substrate.

8. The display substrate according to claim 7, wherein the one end of the at least one second power line is located in the middle of the side of the blocking structure away from the plurality of pixel units.

9. The display substrate according to claim 8, wherein
the display substrate further comprises: a row driving region between the blocking structure and the plurality of pixel units; and
a distance between the row driving region and the orthographic projection of the at least one second power line on the base substrate is larger than a distance between the row driving region and an orthographic projection of the at least one first power line on the base substrate.

10. The display substrate according to claim 7, wherein a distance between the second overlapping region and the orthographic projection of the blocking structure on the base substrate is greater than a threshold distance ranging from 80 microns to 150 microns.

11. The display substrate according to claim 1, wherein the display substrate further comprises at least one selected from:
a passivation layer, covering the at least one first power line, and wherein the passivation layer is further provided with an opening, a side of the auxiliary connection structure close to the base substrate is connected with the at least one first power line by the opening, and the other side of the auxiliary connection structure away from the base substrate is connected with the cathode layer;
an encapsulation layer, wherein the encapsulation layer is located on a side of the at least one first power line away from the base substrate, and the encapsulation layer covers a region enclosed by the blocking structure.

12. The display substrate according to claim 11, wherein the display substrate further comprises: a plurality of third power lines disposed on the base substrate, and the plurality of third power lines are electrically connected with transistors in the plurality of pixel units; wherein
an orthographic projection of at least one of the plurality of third power lines on the base substrate is adjacent to the orthographic projection of the at least one first power line on the base substrate; and
orthographic projections of the plurality of third power lines on the base substrate have an overlapping region with the orthographic projection of the auxiliary connection structure on the base substrate, and in the overlapping region, the passivation layer is arranged between the plurality of third power lines and the auxiliary connection structure.

13. The display substrate according to claim 1, wherein
the blocking structure comprises: a first blocking dam and a second blocking dam;
the first blocking dam is farther away from the plurality of pixel units than the second blocking dam is, and a thickness of the first blocking dam is greater than a thickness of the second blocking dam;
the first blocking dam comprises: a first planarization layer pattern, a second planarization layer pattern and a second organic pattern arranged in a direction away from the base substrate;
the second blocking dam comprises: a third planarization layer pattern and a third organic pattern arranged in the direction away from the base substrate; and
the second planarization layer pattern and the third planarization layer pattern comprise a same material, and the first organic pattern, the second organic pattern and the third organic pattern comprise a same material,
or, wherein
the blocking structure comprises: a first blocking dam and a second blocking dam;
the first blocking dam is farther away from the plurality of pixel units than the second blocking dam is, and a thickness of the first blocking dam is greater than a thickness of the second blocking dam;
the first blocking dam comprises: a planarization layer pattern and a second organic pattern sequentially stacked in a direction away from the base substrate;
the second blocking dam comprises: a third organic pattern arranged on the base substrate; and
the first organic pattern, the second organic pattern and the third organic pattern comprise a same material.

14. The display substrate according to claim 13, wherein
the first blocking dam is a first ring, and the second blocking dam is a second ring;
the first organic pattern and a portion of the third organic pattern form a third ring, an orthographic projection of the third ring on the base substrate is located inside an orthographic projection of the second ring on the base substrate, and the orthographic projection of the second ring on the base substrate is located inside an orthographic projection of the first ring on the base substrate; and
the third ring surrounds the plurality of pixel units.

15. The display substrate according to claim 1, wherein
the blocking structure comprises: a first blocking dam and a second blocking dam;
the first blocking dam is farther away from the plurality of pixel units than the second blocking dam, and a thickness of the first blocking dam is greater than a thickness of the second blocking dam; and
the first organic pattern comprises a portion in direct contact with the second blocking dam.

16. The display substrate according to claim 15, wherein
the at least one first power line comprises: a straight portion and an arc-shaped portion which together surround a region where the plurality of pixel units are located; and an orthographic projection of the portion of the first organic pattern in direct contact with the second blocking dam is in an orthographic projection of the arc-shaped portion on the base substrate.

17. The display substrate according to claim 1, wherein a width of an overlapped portion, which is connected with the first power line and overlaps with the first power line, of the auxiliary connection structure is arranged to be relatively wider, and a width of a portion of the auxiliary connection structure away from the overlapped portion is arranged to be relatively narrower.

18. A display device, wherein the display device comprises: a display substrate comprising:
   a base substrate;
   a plurality of pixel units, wherein the plurality of pixel units are located on the base substrate;
   a blocking structure, wherein the blocking structure surrounds the plurality of pixel units;
   an auxiliary connection structure, comprising a first side surface and a second side surface which are opposite to each other, wherein the first side surface is closer to the plurality of pixel units than the second side surface is;
   a cathode layer, located on a side of the auxiliary connection structure away from the base substrate;
   a first organic pattern, located on the side of the auxiliary connection structure away from the base substrate;
   at least one first power line, located on the base substrate, wherein the at least one first power line comprises a first portion, a second portion and a first metal layer, wherein the first portion is located on a side of the blocking structure away from the plurality of pixel units and is configured to receive a power signal, the second portion is connected with the cathode layer by the auxiliary connection structure, and the second portion has a first connection position and a second connection position, the second portion is connected with the auxiliary connection structure at both the first connection position and the second connection position, and a distance between the first connection position and the blocking structure is greater than a distance between the second connection position and the blocking structure;
wherein the at least one first power line further comprises a second metal layer located on a side of the first metal layer away from the base substrate, and a side of the second metal layer away from the first metal layer is in contact with the auxiliary connection structure; or
wherein the display substrate further comprises an auxiliary metal layer located on a side of the first metal layer away from the base substrate, and a side of the auxiliary metal layer away from the first metal layer is in contact with the auxiliary connection structure.

* * * * *